US00RE46458E

(19) United States
(12) Reissued Patent
Lee et al.

(10) Patent Number: US RE46,458 E
(45) Date of Reissued Patent: Jun. 27, 2017

(54) DTV TRANSMITTING SYSTEM AND METHOD OF PROCESSING BROADCAST DATA THEREIN

(71) Applicant: LG ELECTRONICS INC., Seoul (KR)

(72) Inventors: Hyoung Gon Lee, Seoul (KR); In Hwan Choi, Seoul (KR); Kook Yeon Kwak, Seoul (KR); Byoung Gill Kim, Seoul (KR); Won Gyu Song, Seoul (KR); Sung Ryong Hong, Seoul (KR); Jong Moon Kim, Gyeonggi-do (KR); Jae Hyung Kim, Seoul (KR); Jin Woo Kim, Seoul (KR)

(73) Assignee: LG ELECTRONICS INC., Seoul (KR)

(21) Appl. No.: 14/590,728

(22) Filed: Jan. 6, 2015

Related U.S. Patent Documents

Reissue of:
(64) Patent No.: 8,428,151
Issued: Apr. 23, 2013
Appl. No.: 13/231,736
Filed: Sep. 13, 2011

U.S. Applications:
(63) Continuation of application No. 14/483,032, filed on Sep. 10, 2014, now Pat. No. Re. 46,124, which is an (Continued)

(30) Foreign Application Priority Data

Sep. 15, 2006 (KR) ..... 10-2006-0089736

(51) Int. Cl.
*H04L 27/00* (2006.01)
*H03M 13/03* (2006.01)
*H04N 21/2383* (2011.01)

(52) U.S. Cl.
CPC ..... *H03M 13/03* (2013.01); *H04N 21/2383* (2013.01)

(58) Field of Classification Search
CPC ..... H04N 5/22; H04N 5/232
(Continued)

(56) References Cited

U.S. PATENT DOCUMENTS 6,985,420 B2 1/2006 Shishido
7,100,182 B2 8/2006 Choi et al.
(Continued)

FOREIGN PATENT DOCUMENTS

KR 10-1998-0007139 3/1998
KR 10-2003-0026236 3/2003
(Continued)

OTHER PUBLICATIONS

Korean Intellectual Property Office Application Serial No. 10-2006-0089736, Notice of Allowance dated May 31, 2013, 2 pages.

*Primary Examiner* — Jalatee Worjloh
(74) *Attorney, Agent, or Firm* — Dentons US LLP

(57) ABSTRACT

A digital television transmitting system includes a frame encoder, a block processor, a group formatter, and a multiplexer. The frame encoder forms an enhanced data frame and encodes the data frame for error correction and for error detection. The block processor further encodes the encoded data frame at a rate of 1/2 or 1/4, and the group formatter divides the encoded data frame into a plurality of enhanced data blocks and maps the divided data blocks into a plurality of enhanced data groups, respectively. The multiplexer multiplexes the enhanced data groups with main data.

1 Claim, 12 Drawing Sheets

Related U.S. Application Data application for the reissue of Pat. No. 8,428,151, said application No. 14/483,032 is a continuation of application No. 12/833,895, filed on Jul. 9, 2010, now Pat. No. 8,050,327, which is a continuation of application No. 11/855,966, filed on Sep. 14, 2007, now Pat. No. 7,782,958.

(60) Provisional application No. 60/884,205, filed on Jan. 9, 2007.

(58) Field of Classification Search
USPC ..... 375/268, 269, 295, 300, 931, 330, 340; 348/240.1, 207.99, 22.1; 381/56, 92
See application file for complete search history.

(56) References Cited

U.S. PATENT DOCUMENTS

| | | | | |
|---|---|---|---|---|
| 7,580,643 | B2 | 8/2009 | Moore et al. | |
| 7,644,343 | B2 | 1/2010 | Gubbi et al. | |
| 7,782,958 | B2 | 8/2010 | Lee et al. | |
| 7,797,607 | B2 | 9/2010 | Choi et al. | |
| 7,933,356 | B2 * | 4/2011 | Kim et al. | 375/295 |
| 7,944,988 | B2 | 5/2011 | Birru | |
| 8,204,137 | B2 * | 6/2012 | Kim et al. | 375/240.27 |
| 8,619,900 | B2 | 12/2013 | Jeong et al. | |
| 2002/0154709 | A1 | 10/2002 | Choi et al. | |
| 2005/0243775 | A1 * | 11/2005 | Rhee et al. | 370/336 |
| 2005/0249301 | A1 * | 11/2005 | Jeong et al. | 375/265 |
| 2006/0039503 | A1 | 2/2006 | Choi et al. | |
| 2007/0121681 | A1 | 5/2007 | Kang et al. | |
| 2007/0281757 | A1 | 12/2007 | Iguchi et al. | |
| 2007/0291854 | A1 | 12/2007 | Song et al. | |
| 2008/0069147 | A1 | 3/2008 | Lee et al. | |
| 2009/0052569 | A1 * | 2/2009 | Park et al. | 375/265 |

FOREIGN PATENT DOCUMENTS

| | | |
|---|---|---|
| KR | 10-2004-0108314 | 12/2004 |
| KR | 10-2006-0057266 | 5/2006 |
| WO | 2005/006759 | 1/2005 |
| WO | 2005/115001 | 12/2005 |

* cited by examiner

DTV TRANSMITTING SYSTEM AND METHOD OF PROCESSING BROADCAST DATA THEREIN

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application *is a continuation reissue of U.S. patent application Ser. No. 14/483,032, filed on Sep. 10, 2014, currently pending, which is a reissue of U.S. Pat. No. 8,428,151, issued on Apr. 23, 2013 from U.S. patent application Ser. No. 13/231,736, filed on Sep. 13, 2011, which* is a continuation of U.S. patent application Ser. No. 12/833,895, filed on Jul. 9, 2010, now U.S. Pat. No. 8,050,327, which is a continuation of U.S. *patent* application Ser. No. 11/855,966, filed on Sep. 14, 2007, now U.S. Pat. No. 7,782,958, which claims the benefit of earlier filing date and right of priority to Korean Patent Application No. 10-2006-0089736, filed on Sep. 15, 2006, and also claims the benefit of U.S. Provisional Application Ser. No. 60/884,205, filed on Jan. 9, 2007, the contents of which are all hereby incorporated by reference herein in their entirety.

BACKGROUND OF THE INVENTION

1. Field of the Invention

The present invention relates to a digital television (DTV) transmitting system and receiving system and methods of processing broadcast data in the DTV transmitting system and receiving system.

2. Discussion of the Related Art

Presently, the technology for processing digital signals is being developed at a vast rate, and, as a larger number of the population uses the Internet, digital electric appliances, computers, and the Internet are being integrated. Therefore, in order to meet with the various requirements of the users, a system that can transmit diverse supplemental information in addition to video/audio data through a digital television channel needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the video/audio data. However, with the advent of digital broadcasting, digital television receiving systems that receive only video/audio data are already supplied to the market. Therefore, the supplemental data that are transmitted through the same channel as the video/audio data should not influence the conventional receiving systems that are provided in the market. In other words, this may be defined as the compatibility of broadcast system, and the supplemental data broadcast system should be compatible with the broadcast system. Herein, the supplemental data may also be referred to as enhanced data. Furthermore, in a poor channel environment, the receiving performance of the conventional receiving system may be deteriorated. More specifically, resistance to changes in channels and noise is more highly required when using portable and/or mobile receivers.

SUMMARY OF THE INVENTION

Accordingly, the present invention is directed to a digital television (DTV) transmitting system and a DTV receiving system and a method of processing broadcast data that substantially obviate one or more problems due to limitations and disadvantages of the related art.

An object of the present invention is to provide a DTV transmitting system and a DTV receiving system and a method of processing broadcast data that is suitable for transmitting supplemental data and that is highly resistant to noise.

Another object of the present invention is to provide a DTV transmitting system and a DTV receiving system and a method of processing broadcast data that can perform additional encoding on enhanced data and transmitting the processed enhanced data, thereby enhancing the performance of the receiving system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitting system includes a frame encoder, a block processor, a group formatter, and a multiplexer. The frame encoder forms an enhanced data frame having K rows of enhanced data, where each row of enhanced data has a length of N bytes. The frame encoder then encodes the enhanced data frame for error correction, and further encodes the encoded enhanced data for error detection. The block processor encodes the enhanced data frame encoded for error correction and detection at an encoding rate of 1/2 or 1/4. The group formatter divides the enhanced data frame into a plurality of enhanced data blocks and maps the divided enhanced data blocks into a plurality of enhanced data groups, respectively. The multiplexer multiplexes the enhanced data groups with main data.

In another aspect of the present invention, a digital television (DTV) receiving system includes a tuner and a frame decoder. The tuner tunes to a channel to receive a digital television (DTV) signal from a DTV transmitting system or broadcaster. The DTV signal includes a plurality of enhanced data packets into which a plurality of divided enhanced data blocks are mapped, respectively. The frame decoder forms an enhanced data frame by combining the plurality of enhanced data blocks. The frame decoder decodes the enhanced data frame for error detection and detects a number of Cyclic Redundancy Check (CRC) errors in the enhanced data frame. The frame decoder further generates a reliability map of the enhanced data frame, and decodes the enhanced data frame for error correction using the detected number of CRC errors and the reliability of the enhanced data frame.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, weather forecast, and so on, or consist of video/audio data. Additionally, the known data refer to data already known based upon a pre-determined agreement between the transmitting system and the receiving system. Furthermore, the main data consist of data that can be received from the conventional receiving system, wherein the main data include video/audio data. By performing additional encoding on the enhanced data and by transmitting the processed data, the present invention may provide robustness to the enhanced data, thereby enabling the data to respond more effectively to the channel environment that undergoes frequent changes. For example, the present invention relates to additionally performing at least one of error correction encoding and error detection encoding on the enhanced data, thereby transmitting the processed data.

Figure 1:
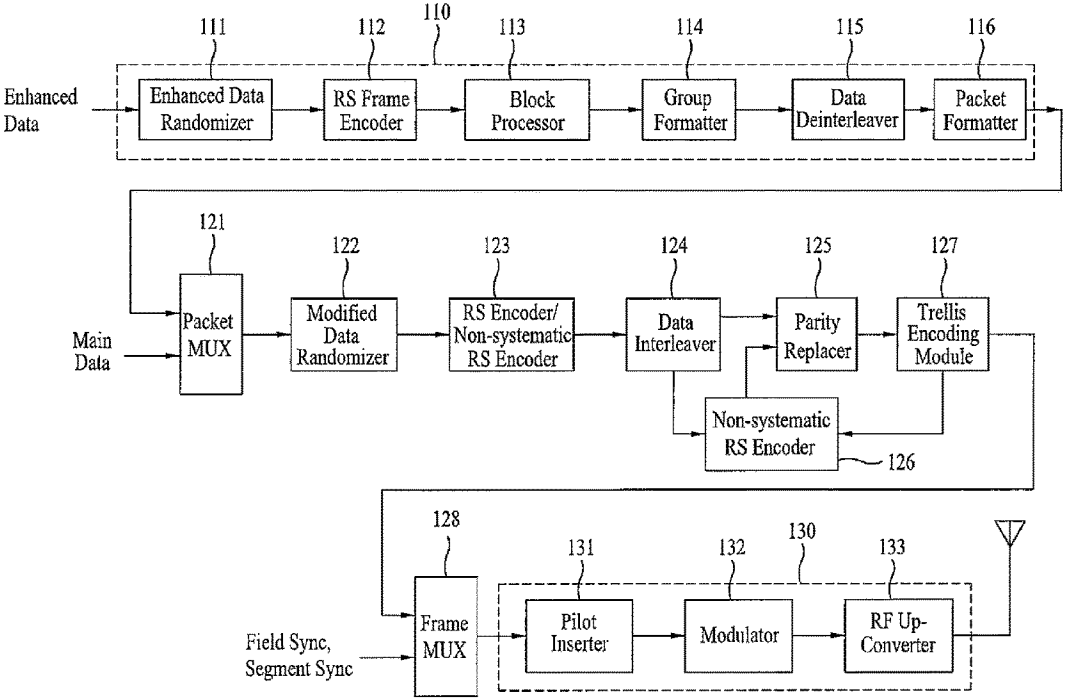
FIG. 1 illustrates a block diagram of a digital broadcast transmitting system according to an embodiment of the present invention.

FIG. 1 illustrates an example of a digital broadcast transmitting system (or DTV transmitting system) according to the present invention. The digital broadcast transmitting system of FIG. 1 includes a pre-processor 110, a packet multiplexer 121, a data randomizer 122, a RS encoder/non-systematic RS encoder 123, a data interleaver 124, a parity replacer 125, a non-systematic RS encoder 126, a trellis encoding module 127, a frame multiplexer 128, and a transmitting unit 130. The pre-processor 110 includes an enhanced data randomizer 111, a RS frame encoder 112, a block processor 113, a group formatter 114, a data deinterleaver 115, and a packet formatter 116.

In the above-described structure of the present invention, the main data are inputted to the packet multiplexer 121, and the enhanced data are inputted to the enhanced data randomizer 111 of the pre-processor 110, which performs additional encoding so that the enhanced data can respond more effectively to noise and channel environment that undergoes frequent changes. The enhanced data randomizer 111 receives the enhanced data and randomizes the received data, which are then outputted to the RS frame encoder 112. At this point, by having the enhanced data randomizer 111 randomize the enhanced data, the randomizing process performed by a data randomizer 122 in a later process, the data randomizer 122 being positioned further behind, may be omitted. Herein, a randomizer identical to that of the conventional randomizer or a different type of randomizer may be used as the randomizer for randomizing the enhanced data.

The RS frame encoder 112 performs at least one of an error correction encoding process and an error detection encoding process on the inputted enhanced data, which have been randomized, so as to provide robustness on the corresponding data. Thus, by providing robustness to the enhance data, a group error that may occur due to a change in the frequency environment may be scattered, thereby enabling the corresponding data to respond to the severely vulnerable and frequently changing frequency environment. The RS frame encoder 112 may also perform a row permutation process, which permutes enhanced data having a predetermined size in row units. In the example given herein, the RS frame encoder 112 performs an error correction encoding process on the inputted enhanced data, so as to add data required for performing error correction. Thereafter, the RS frame encoder 112 performs an error detection encoding process on the error correction encoded data, so as to add data required for performing error detection. Herein, RS encoding is applied as the error correction encoding process, and cyclic redundancy check (CRC) encoding is applied as the error detection encoding process. When performing RS encoding, parity data that are to be used for error correction are generated. And, when performing CRC encoding, CRC data that are to be used for error detection are generated.

FIG. 2(a) to FIG. 2(e) illustrate examples showing the steps of an encoding process performed by the RS frame encoder 112 according to an embodiment of the present invention. More specifically, the RS frame encoder 112 first divides the inputted enhanced data into units of an equal length A. Herein, the value A will be decided by the system designer. Accordingly, in the example of the present invention given herein, the specific length is equal to 187. Herein, the specific length A may also be referred to as packet A. For example, if the enhanced data being inputted as shown in FIG. 2(a) correspond to a MPEG transport stream (TS) packet configured of 188-byte units, the first MPEG synchronization byte is removed, as shown in FIG. 2(b), thereby configuring packet A with 187 bytes.

Herein, the MPEG synchronization bytes are removed because each of the enhanced data packets has the same value. Furthermore, the process of removing the MPEG synchronization bytes may be performed while the enhanced data randomizer 111 randomizes the enhanced data. Herein, the RS frame encoder 112 may omit the process of removing the MPEG synchronization bytes. And, in this case, when the receiving system (or DTV receiving system) adds the MPEG synchronization bytes to the data, the derandomizer performs the process instead of the RS frame decoder. Therefore, if a fixed byte that can be removed is not included in the inputted enhanced data, or if the length of the inputted packet is not equal to 187 bytes, the enhanced data that are being inputted are divided into 187-byte units, thereby configuring a packet A that is divided into 187 bytes.

Subsequently, as shown in FIG. 2(c), N number of packet A's each configured of 187 bytes is grouped to configure a single RS frame. At this point, the RS frame is configured as a RS frame having the size of N*187 bytes, in which the 187-byte packet A's are sequentially inputted. In order to simplify the description of the present invention, the RS frame configured as described above will also be referred to as a first RS frame. More specifically, only pure enhanced data are included in the first RS frame, which is the same as the structure configured of 187 N-byte rows. Thereafter, the enhanced data within the RS frame are divided into an equal size. Then, when the divided enhanced data are transmitted in the same order as the input order for configuring the RS frame, and when one or more errors have occurred at a particular point during the transmitting and/or receiving processes, the errors are also clustered (or gathered) within the RS frame. In this case, the receiving system uses a RS erasure decoding method when performing error correction decoding, thereby enhancing the error correction ability. At this point, the N number of columns within the N number of RS frame includes 187 bytes, as shown in FIG. 2(c).

At this point, a (Nc,Kc)-RS encoding process is performed on each column, so as to generate Nc−Kc number of parity bytes. Then, the newly generated parity bytes are added after the very last byte of the corresponding column, thereby creating a column of Nc bytes. Herein, the value of Nc is greater than the value of Kc. For example, in this embodiment, the value of Nc is equal to 235, and the value of Kc is equal to 187. Accordingly, (235,187)-RS encoding is performed on each column, thereby generating 48 parity bytes. Furthermore, as shown in FIG. 2(d), if (235,187)-RS encoding is performed on all N number of columns shown in FIG. 2(c), a RS frame having the size of N(column)*235 (row) bytes may be created. Hereinafter, the RS frame having RS parity bytes added thereto will be referred to as a second RS frame for simplicity. More specifically, the second RS frame corresponds to 235 rows each configured of N number of data bytes.

As shown in FIG. 2(c) or FIG. 2(d), each row of the RS frame is configured of N bytes. However, depending upon channel conditions between the transmitting system and the receiving system, error may be included in the RS frame. When errors occur as described above, CRC data (or CRC code or CRC checksum) may be used on each row unit in order to verify whether error exists in each row unit. The RS frame encoder 112 performs CRC encoding on the enhanced data being RS encoded so as to create (or generate) the CRC data. The CRC data being generated by CRC encoding process may be used to indicate whether the enhanced data have been damaged while being transmitted through the channel.

The present invention may also use different error detection encoding methods other than the CRC encoding method. Alternatively, the present invention may use the error correction encoding method to enhance the overall error correction ability of the receiving system. FIG. 2(e) illustrates an example of using a 2-byte (i.e., 16-bit) CRC checksum as the CRC data. Herein, a 2-byte CRC checksum is generated for N number of bytes of each row, thereby adding the 2-byte CRC checksum at the end of the N number of bytes. Thus, each row is expanded to (N+2) number of bytes. Equation 1 below corresponds to an exemplary equation for generating a 2-byte CRC checksum for each row being configured of N number of bytes.

$$g(x)=x^{16}+x^{12}+x^{5}+1 \qquad \text{Equation 1}$$

The process of adding a 2-byte checksum in each row is only exemplary. Therefore, the present invention is not limited only to the example proposed in the description set forth herein. In order to simplify the understanding of the present invention, the RS frame having the RS parity and CRC checksum added therein will hereinafter be referred to as a third RS frame. More specifically, the third RS frame corresponds to 235 rows each configured of (N+2) number of bytes. As described above, when the process of RS encoding and CRC encoding are completed, the (N*187)-byte RS frame is expanded to a (N+2)*235-byte RS frame. Furthermore, the RS frame that is expanded, as shown in FIG. 2(e), is inputted to the block processor 113. Then, the block processor 113 encodes the RS-encoded and CRC-encoded enhanced data at a coding rate of G/H. Thereafter, the processed data are outputted to the group formatter 114.

In order to do so, the block processor 113 includes a byte-bit converter 301, a symbol encoder 302, a symbol interleaver 303, and a symbol-byte converter 304. The byte-bit converter 301 divides the enhanced data bytes that are inputted from the RS frame encoder 112 into bits, which are then outputted to the symbol encoder 302. The byte-bit converter 301 may also receive supplemental information data, such as signaling information. The supplemental information data bytes are also divided into bits so as to be outputted to the symbol encoder 302. Herein, the supplemental information data, such as signaling information, may be processed with the same data processing step as that of the enhanced data. More specifically, the supplemental information data may be inputted to the block processor 113 by passing through the enhanced data randomizer 111 and the RS frame encoder 112. Alternatively, the supplemental information data may also be directly outputted to the block processor 113 without passing through the enhanced data randomizer 111 and the RS frame encoder 112. Herein, the signaling information corresponds to information required by the receiving system (or receiver) to receive and process data included in the data group. Such required information may include data group information, multiplexing information, and burst information.

The symbol encoder 302 corresponds to a G/H-rate encoder encoding the inputted data from G bits to H bits and outputting the data encoded at the coding rate of G/H. For example, if 1 bit of the input data is coded to 2 bits and outputted, then G is equal to 1 and H is equal to 2 (i.e., G=1 and H=2). Alternatively, if 1 bit of the input data is coded to 4 bits and outputted, then G is equal to 1 and H is equal to 4 (i.e., G=1 and H=4). According to the embodiment of the present invention, it is assumed that the symbol encoder 302 performs either a coding rate of 1/2 (also referred to as a 1/2-rate encoding process) or an encoding process at a coding rate of 1/4 (also referred to as a 1/4-rate encoding process). More specifically, the symbol encoder 302 performs one of 1/2-rate encoding and 1/4-rate encoding on the inputted enhanced and the supplemental information data, such as signaling information. Thereafter, the supplemental information data are also recognized as the enhanced data and processed accordingly.

The 1/4-rate encoding process may provide greater error correction performance due to its higher coding rate as compared to the 1/2-rate encoding process. Therefore, in a later process, the group formatter 114 allocates the data encoded at the coding rate of 1/4 to a region with lower receiving performance. Alternatively, the group formatter 114 allocated the data encoded at the coding rate of 1/2 to a region with greater receiving performance. Thus, the difference in the receiving performance within the group formatter 114 may be reduced.

In case of performing the 1/2-rate encoding process, the symbol encoder 302 receives 1 bit and encodes the received 1 bit to 2 bits (i.e., 1 symbol). Then, the symbol encoder 302 outputs the processed 2 bits (or 1 symbol). On the other hand, in case of performing the 1/4-rate encoding process, the symbol encoder 302 receives 1 bit and encodes the received 1 bit to 4 bits (i.e., 2 symbols). Then, the symbol encoder 302 outputs the processed 4 bits (or 2 symbols).

Figure 4:
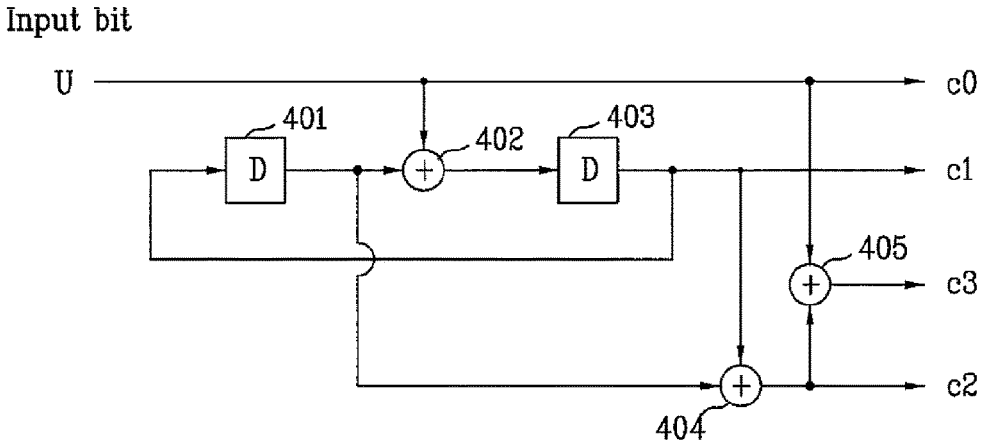
FIG. 4 illustrates a detailed block diagram of a symbol encoder shown in FIG. 3 according to an embodiment of the present invention.

FIG. 4 illustrates a detailed block diagram of the symbol encoder 302. The symbol encoder 302 includes two delay units 401 and 403 and three adders 402, 404, and 405. Herein, the symbol encoder 302 encodes an input data bit U and outputs the coded bit U to 4 bits (c0 to c3). At this point, the data bit U is directly outputted as uppermost bit c0 and simultaneously encoded as lower bit c1c2c3 and then outputted. More specifically, the input data bit U is directly outputted as the uppermost bit c0 and simultaneously outputted to the first and third adders 402 and 405. The first adder 402 adds the input data bit U and the output bit of the first delay unit 401 and, then, outputs the added bit to the second delay unit 403. Then, the data bit delayed by a pre-determined time (e.g., by 1 clock) in the second delay unit 403 is outputted as lower bit c1 and simultaneously fed-back to the first delay unit 401. The first delay unit 401 delays the data bit fed-back from the second delay unit 403 by a pre-determined time (e.g., by 1 clock). Then, the first delay unit 401 outputs the delayed data bit to the first adder 402 and the second adder 404. The second adder 404 adds the data bits outputted from the first and second delay units 401 and 403 as a lower bit c2. The third adder 405 adds the input data bit U and the output of the second delay unit 403 and outputs the added data bit as a lower bit c3.

At this point, if the input data bit U corresponds to data encoded at a 1/2-coding rate, the symbol encoder 302 configures a symbol with c1c0 bits from the 4 output bits c0c1c2c3. Then, the symbol encoder 302 outputs the newly configured symbol. Alternatively, if the input data bit U corresponds to data encoded at a 1/4-coding rate, the symbol encoder 302 configures and outputs a symbol with bits c1c0 and, then, configures and outputs another symbol with bits c2c3. According to another embodiment of the present invention, if the input data bit U corresponds to data encoded at a 1/4-coding rate, the symbol encoder 302 may also configure and output a symbol with bits c1c0, and then repeat the process once again and output the corresponding bits.

According to yet another embodiment of the present invention, the symbol encoder outputs all four output bits U c0c1c2c3. Then, when using the 1/2-coding rate, the symbol interleaver 303 located behind the symbol encoder 302 selects only the symbol configured of bits c1c0 from the four output bits c0c1c2c3. Alternatively, when using the 1/4-coding rate, the symbol interleaver 303 may select the symbol configured of bits c1c0 and then select another symbol configured of bits c2c3. According to another embodiment, when using the 1/4-coding rate, the symbol interleaver 303 may repeatedly select the symbol configured of bits c1c0.

The output of the symbol encoder 302 is inputted to the symbol interleaver 303. Then, the symbol interleaver 303 performs block interleaving in symbol units on the data outputted from the symbol encoder 302. Any interleaver performing structural rearrangement (or realignment) may be applied as the symbol interleaver 303 of the block processor. However, in the present invention, a variable length symbol interleaver that can be applied even when a plurality of lengths is provided for the symbol in order to allow its order to be rearranged may also be used herein.

Figure 5:
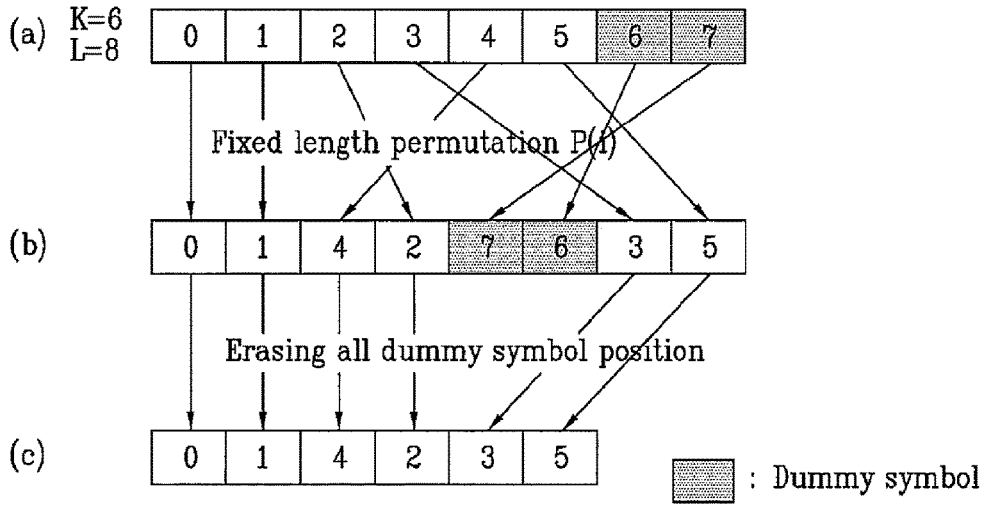
FIG. 5(a) to FIG. 5(c) illustrate a variable length interleaving process of a symbol interleaver shown in FIG. 3.

FIG. 5 illustrates a symbol interleaver according to an embodiment of the present invention. Herein, the symbol interleaver according to the embodiment of the present invention corresponds to a variable length symbol interleaver. As described above, the variable length symbol interleaver may be applied even when a plurality of lengths is provided for the symbol in order to rearrange its order. Particularly, FIG. 5 illustrates an example of the symbol interleaver when K=6 and L=8. Herein, K indicates a number of symbols that are outputted for symbol interleaving from the symbol encoder 302. And, L represents a number of symbols that are actually interleaved by the symbol interleaver 303.

In the present invention, the symbol interleaver 303 should satisfy the conditions of $L=2^n$ (wherein n is an integer) and of $L \geq K$. If there is a difference in value between K and L, (L−K) number of null (or dummy) symbols is added, thereby creating an interleaving pattern. Therefore, K becomes a block size of the actual symbols that are inputted to the symbol interleaver 303 in order to be interleaved. L becomes an interleaving unit when the interleaving process is performed by an interleaving pattern created from the symbol interleaver 303. The example of what is described above is illustrated in FIG. 5.

Figure 2:
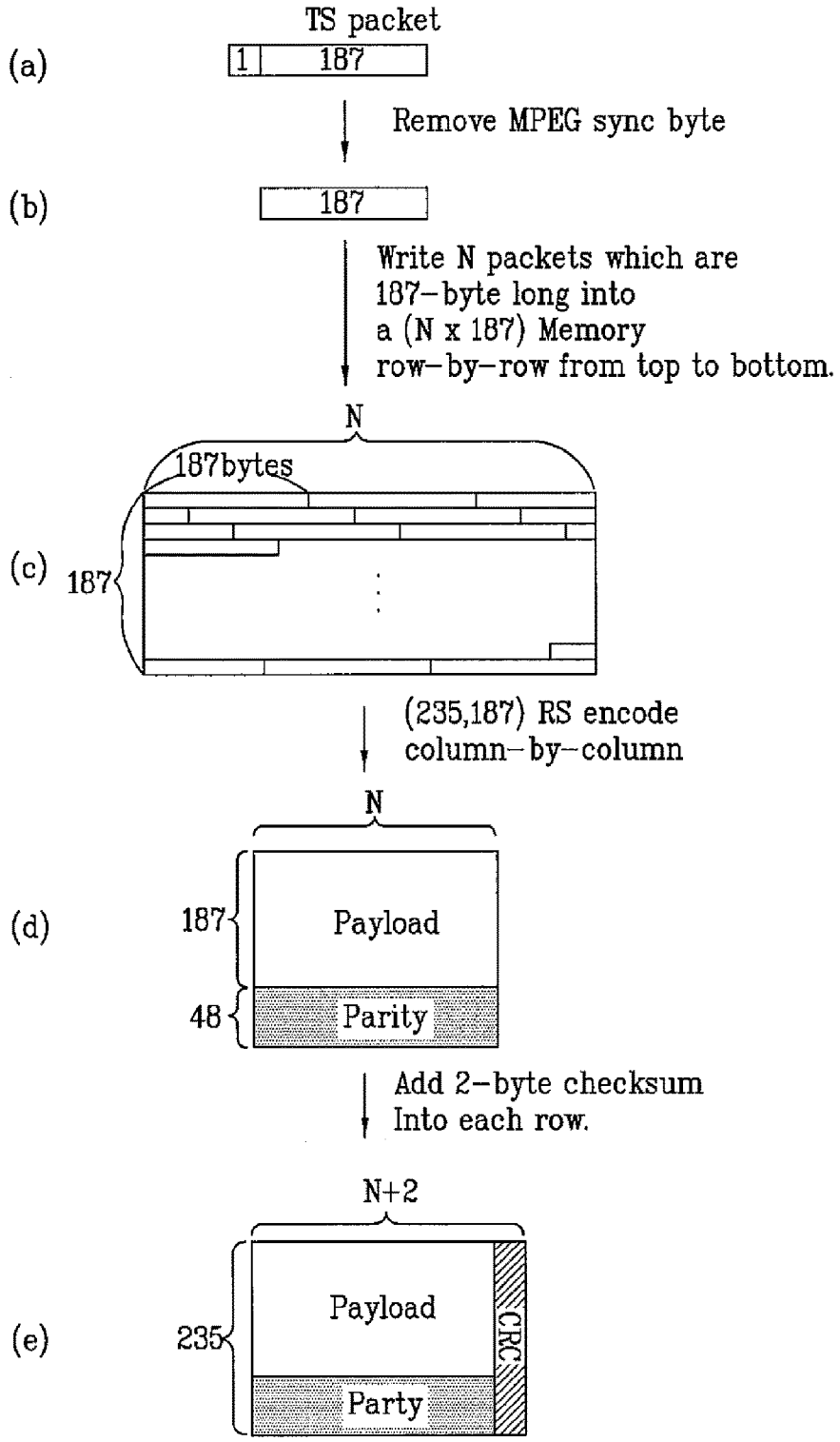
FIG. 2(a) to FIG. 2(e) illustrate examples showing the steps of an error correction coding process and an error detection coding process according to an embodiment of the present invention.
Figure 3:
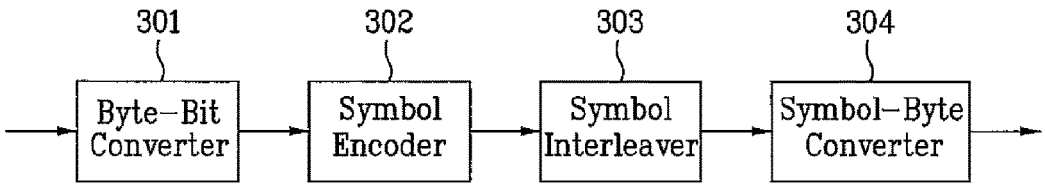
FIG. 3 illustrates a detailed block diagram of a block processor according to an embodiment of the present invention.

More specifically, FIG. 5(a) to FIG. 5(c) illustrate a variable length interleaving process of a symbol interleaver shown in FIG. 3. The number of symbols outputted from the symbol encoder 302 in order to be interleaved is equal to 6 (i.e., K=6). In other words, 6 symbols are outputted from the symbol encoder 302 in order to be interleaved. And, the actual interleaving unit (L) is equal to 8 symbols. Therefore, as shown in FIG. 5(a), 2 symbols are added to the null (or dummy) symbol, thereby creating the interleaving pattern. Equation 2 shown below described the process of sequentially receiving K number of symbols, the order of which is to be rearranged, and obtaining an L value satisfying the conditions of $L=2^n$ (wherein n is an integer) and of $L \geq K$, thereby creating the interleaving so as to realign (or rearrange) the symbol order.

In relation to all places, wherein $0 \leq i \leq L-1$, $$P(i)=\{S \times i \times (i+1)/2\} \bmod L \qquad \text{Equation 2}$$

Herein, $L \geq K$, $L=2^n$, and n and S are integers. Referring to FIG. 5, it is assumed that S is equal to 89, and that L is equal to 8, and FIG. 5 illustrates the created interleaving pattern and an example of the interleaving process. As shown in FIG. 5(b), the order of K number of input symbols and (L-K) number of null symbols is rearranged by using the above-mentioned Equation 2. Then, as shown in FIG. 5(c), the null byte places are removed, so as to rearrange the order, by using Equation 3 shown below. Thereafter, the symbol that is interleaved by the rearranged order is then outputted to the symbol-byte converter 304.

$$\text{if } P(i)>K-1\text{, then } P(i) \text{ position is removed and rearranged} \qquad \text{Equation 3}$$

Subsequently, the symbol-byte converter 304 converts to bytes the enhanced data symbols processed by the symbol interleaver 303, wherein the rearrangement of the symbol order is completed, and wherein the processed symbols are then outputted in accordance with the rearranged order. Thereafter, the symbol-byte converter 304 outputs the converted bytes to the group formatter 114.

The group formatter 114 inserts the enhanced data outputted from the block processor 113 (herein, the enhanced data may include supplemental information data such as signaling information including transmission information) in a corresponding region within the data group, which is configured according to a pre-defined rule. Furthermore, in relation with the data deinterleaving process, various types of places holders or known data are also inserted in corresponding regions within the data group. At this point, the data group may be described by at least one hierarchical region. Herein, the data allocated to each region may vary depending upon the characteristic of each hierarchical region. Additionally, each group is configured to include a field synchronization signal.

Figure 6:
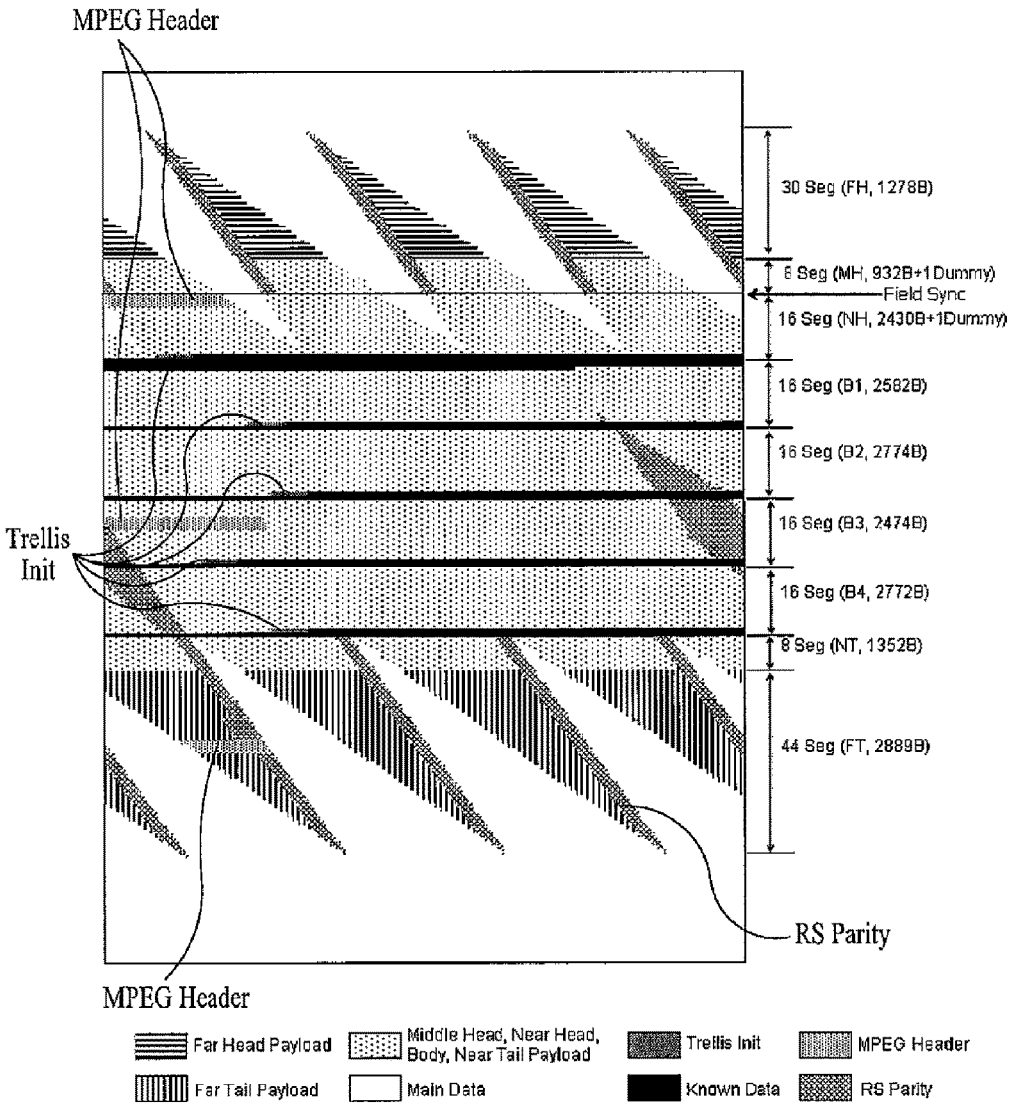
FIG. 6 and FIG. 7 respectively illustrate a data configuration at before and after a data interleaver with the transmitting system according to the present invention.
Figure 7:
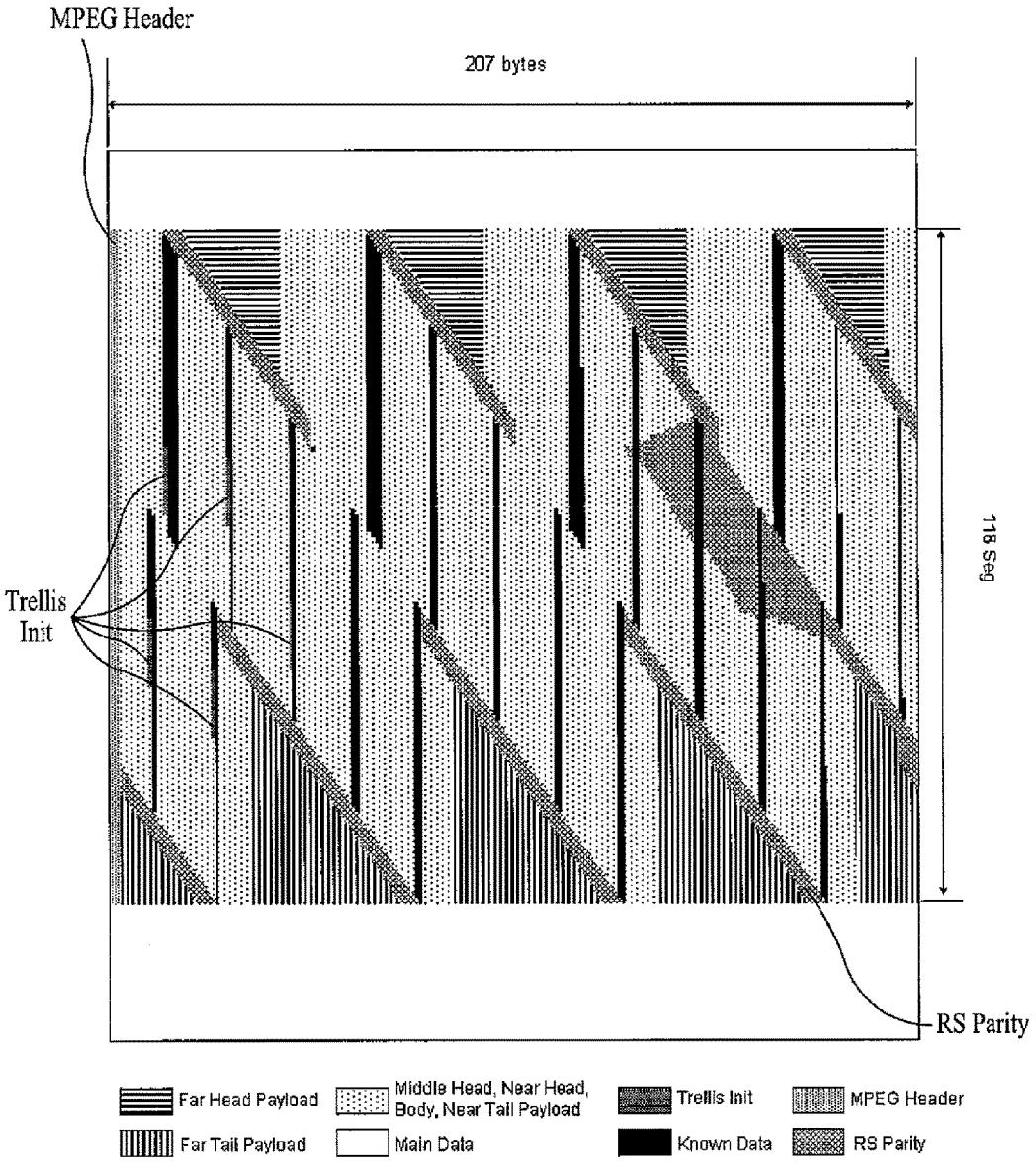

FIG. 6 illustrates an example of identifying and aligning data bytes prior to being processed with data deinterleaving. FIG. 7 illustrates an example of identifying and aligning data bytes after being processed with data deinterleaving. In other words, FIG. 6 illustrates an example of the data bytes being data interleaved, and FIG. 7 illustrates an example of the data bytes prior to being data interleaved. FIG. 6 illustrates an example of dividing the data group into three hierarchical regions: a head region, a body region, and a tail region. Accordingly, in the data group that is inputted for the data deinterleaving process, data are first inputted to the head region, then inputted to the body region, and inputted finally to the tail region. In the example of the present invention, as shown in FIG. 6, the head, body, and tail regions are configured so that the body region is not mixed with the main data region within the data group. Furthermore, in the present invention, the head, body, and tail regions may each be divided into lower hierarchical regions (or sub-regions).

Further, each of the head, body, and tail regions is hierarchically divided into a plurality of lower regions. For example, the head region may be divided into 3 lower hierarchical regions: a far head (FH) region, a middle head (MH) region, and a near head (NH) region. The body region may be divided into 4 lower hierarchical regions: a first lower body (B1) region, a second lower body (B2) region, a third lower body (B3) region, and a fourth lower body (B4) region. And, finally, the tail region may be divided into 2 lower hierarchical regions: a far tail (FT) region and a near tail (NT) region.

FIG. 6 shows an example of the group formatter 114 inserting the enhanced data that are being outputted from the block processor 113 to the middle head (MH) region, the near head (NH) region, the first to fourth lower body (B1 to B4) regions (or body sub-regions), and the near tail (NT) region. Herein, the type of enhanced data may vary depending upon the characteristic of each region. The data group is divided into a plurality of regions so that each region may be used for different purposes. More specifically, regions having less interference with the main data may show more enhanced receiving performance as compared with regions having more interference with the main data. Additionally, when using the system in which the known data are inserted in the data group and then transmitted, and when a long set of consecutive known data is to be periodically (or regularly) inserted in the enhanced data, the body region is capable of regularly receiving such enhanced data having a predetermined length. However, since the enhanced data may be mixed with the main data in the head and tail regions, it is difficult to regularly insert the known data in these regions, and it is also difficult to insert long known data sets that are consecutive in these regions.

Detailed examples of data being allocated to each of the corresponding the far head (FH) region, the middle head (MH) region, the near head (NH) region, the first to fourth lower body (B1 to B4) regions (or body sub-regions), the near tail (NT) region, and the far tail (FT) region within the data group will now described in detail. Details such as the size of the data group, the number of hierarchical regions within the data group and the size of each hierarchical region, and the number of enhanced data bytes that may be inserted in each hierarchical region may vary depending upon the design of the system designer. Therefore, the above-described embodiment is merely an example that can facilitate the description of the present invention.

More specifically, the body region (i.e., sub-regions B1, B2, B3, and B4) is a region within the data group in which long known data sequences may be periodically inserted. Herein, the body region may be set so that the main data are not mixed with other types of data. FIG. 6 illustrates an example in which known data sequences are respectively allocated to each of the fore-end and rear-end portions within each lower body region (sub-regions B1, B2, B3, and B4). For example, referring to FIG. 6, 2584 bytes of the enhanced data may be inserted in region B1, 2774 bytes may be inserted in region B2, 2474 bytes may be inserted in region B3, and 2772 bytes may be inserted in region B4. Herein, trellis initialization data or known data, MPEG header, and RS parity are not included in the enhanced data.

Referring to FIG. 6, the near head (NH) region corresponds to a region allocated between a field synchronization region that is to be inserted in the data group and a region in which a first known data sequence is to be inserted. The length of the field synchronization region is equal to that of one sequence (i.e., 832 symbols). In the example shown in FIG. 6, 2431 bytes of the enhanced data may be inserted in the near head (NH) region. As described above, when the body region includes a known data sequence at both ends, the receiving system uses channel information that can obtain known data or field synchronization data, so as to perform equalization, thereby providing enforced equalization performance.

Also, the middle head (MH) region includes a region located within 8 segments at the beginning of a field synchronization region within the data group. In this case, the receiving system may perform equalization by using channel information obtained from the field synchronization region, thereby enabling the system to respond to the channel changes. Referring to FIG. 6, 932 bytes of the enhanced data may be inserted in the middle head (MH) region. Similarly, trellis initialization data or known data, MPEG header, and RS parity are not included in the enhanced data.

The far head (FH) region includes a region located within 30 segments including and preceding the $9^{th}$ segment of the field synchronization region. Referring to FIG. 6, 1278 bytes of the enhanced data may be inserted in the far head (FH) region. Since the far head (FH) region is located further apart from the field synchronization region which corresponds to the closest known data region, the receiving system may use the channel information obtained from the field synchronization data when performing channel equalization. Alternatively, the receiving system may also use the most recent channel information of a previous data group. Thus, the performance of the far head (FH) region after being equalized may be deteriorated than the performance of the middle head (MH) region.

Meanwhile, the near tail (NT) region, which is chronologically located behind the body region, corresponds to a region located within 8 segments subsequent to a last known data sequence being inserted in the data group. Referring to FIG. 6, 1352 bytes of the enhanced data may be inserted in the near tail (NT) region. Since the near tail (NT) can use the channel information, which has been obtained from the last known data sequence during the channel equalization process, in order to perform equalization, the near tail (NT) region may provide greater equalization performance than the far tail (FT) region.

The far tail (FT) region corresponds to region allocated within 44 segments including a $9^{th}$ segment subsequent to the last known data sequence within the data group. Referring to FIG. 6, 2889 bytes of the enhanced data may be inserted in the far tail (FT) region. Even if the receiving system uses the channel information obtained from the last known data sequence during the channel equalization process, when the channel changes at a fast rate, equalization may not be performed with perfection in the far tail (FT) region. Therefore, the equalization performance of the far tail (FT) region may be deteriorated as compared to the performance of the near tail (NT) region.

According to another embodiment of the present invention, 2580 bytes of the enhanced data may be inserted in region B1, 2772 bytes may be inserted in region B2, 2472 bytes may be inserted in region B3, and 2772 bytes may be inserted in region B4. Also 1272 bytes of the enhanced data may be inserted in region FH, 930 bytes may be inserted in region MH, 2428 bytes may be inserted in region NH, 1350 bytes may be inserted in region NT, and 2872 bytes may be inserted in region FT.

As shown in FIG. 6, when it is assumed that the data group is allocated with a plurality of hierarchically divided regions, as described above, the block processor 113 may encode the data, which are to be inserted to each region based upon the characteristic of each hierarchical region, at a different coding rate. In the description of the present invention, an example of applying different coding rates based upon regions that are expected to present different performance levels after being equalized by using channel information, which may be used by the receiving system for performing the equalization process. For example, the block processor 113 may encode the enhanced data, which are to be inserted in the near head (NH) region and the body region (B1 to B4), at a coding rate of 1/2. Then, the group formatter 114 may insert the 1/2-rate encoded enhanced data to the near head (NH) region and the body region (B1 to B4).

The block processor 113 may encode the enhanced data, which are to be inserted in the middle head (MH) region and the near tail (NT) region, at a coding rate of 1/4 providing higher error correction performance as compared to the 1/2-coding rate. Then, the group formatter 114 inserts the 1/4-rate encoded enhanced data in the middle head (MH) region and the near tail (NT) region. Furthermore, the block processor 113 may encode the enhanced data, which are to be inserted in the far head (FH) region and the far tail (FT) region, at a coding rate providing higher error correction performance than the 1/4-coding rate. Then, the group formatter 114 may either insert the encoded enhanced data in the far head (FH) region and the far tail (FT) region, as described above, or leave the data in a reserved region for future usage.

In addition, other than the enhanced data, the group formatter 114 also inserts supplemental data, such as signaling information that notifies the overall transmission information, in the data group. Also, apart from the encoded enhanced data outputted from the block processor 113, the group formatter 114 also inserts MPEG header place holders, nonsystematic RS parity place holders, main data place holders, which are related to data deinterleaving in a later process, as shown in FIG. 6. Herein, the main data place holders are inserted because the enhanced data bytes and the main data bytes are alternately mixed with one another in the head and body regions based upon the input of the data deinterleaver, as shown in FIG. 6. For example, with respect to the data outputted after data deinterleaving, the place holder for the MPEG header are allocated at the very beginning of each packet.

Furthermore, the group formatter 114 either inserts known data generated in accordance with a pre-determined method or inserts known data place holders for inserting the known data in a later process. Additionally, place holders for initializing the trellis encoding module 127 are also inserted in the corresponding regions. For example, the initialization data place holders may be inserted in the beginning of the known data sequence. The output of the group formatter 114 is inputted to the data deinterleaver 115. And, the data deinterleaver 115 deinterleaves data by performing an inverse process of the data interleaver on the data and place holders within the data group, which are then outputted to the packet formatter 116. More specifically, when the data and place holders within the data group configured, as shown in FIG. 6, are deinterleaved by the data deinterleaver 115, the data group being outputted to the packet formatter 116 is configured to have the structure shown in FIG. 7.

The packet formatter 116 removes the main data place holders and the RS parity place holders that were allocated for the deinterleaving process from the deinterleaved data being inputted. Then, the packet formatter 116 groups the remaining portion and inserts a MPEG header in the 4-byte MPEG header place holder. Also, when the group formatter 114 inserts known data place holders, the packet formatter 116 may insert actual known data in the known data place holders, or may directly output the known data place holders without any modification in order to make replacement insertion in a later process. Thereafter, the packet formatter 116 identifies the data within the packet-formatted data group, as described above, as a 188-byte unit enhanced data packet (i.e., MPEG TS packet), which is then provided to the packet multiplexer 121.

The packet multiplexer 121 multiplexes the 118-byte unit enhanced data packet and the main data packet outputted from the packet formatter 116 in accordance with a predefined multiplexing method. Then, the packet multiplexer 121 outputs the multiplexed data packets to the data randomizer 122. Herein, the multiplexing method may vary in accordance with various variables of the system design. One of the multiplexing methods of the packet multiplexer 121 consists of identifying an enhanced data burst section and a main data burst section along a time axis, and, then, enabling the two burst sections to be alternately repeated. Herein, at least one data group may be transmitted during the enhanced data burst section, and only the main data may be transmitted during the main data burst section. Herein, the main data may also be transmitted during the enhanced data burst section.

If the enhanced data are outputted in a burst structure, as described above, the receiving system receiving only the enhanced data may turn the power on only during the burst section so as to receive the enhanced data, and may turn the power off during the main data section in which main data are transmitted, so as to prevent the main data from being received, thereby reducing the power consumption of the receiving system.

When the data being inputted correspond to the main data packet, the data randomizer 122 performs the same randomizing process of the conventional randomizer. More specifically, the MPEG synchronization byte included in the main data packet is discarded and a pseudo random byte generated from the remaining 187 bytes is used so as to randomize the data. Thereafter, the randomized data are outputted to the RS encoder/non-systematic RS encoder 123. However, when the inputted data correspond to the enhanced data packet, the MPEG synchronization byte of the 4-byte MPEG header included in the enhanced data packet is discarded, and data randomizing is performed only on the remaining 3-byte MPEG header. Randomizing is not performed on the remaining portion of the enhanced data. Instead, the remaining portion of the enhanced data is outputted to the RS encoder/non-systematic RS encoder 123. This is because the randomizing process has already been performed on the enhanced data by the enhanced data randomizer 111 in an earlier process. Herein, a data randomizing process may or may not be performed on the known data (or known data place holder) and the initialization data place holder included in the enhanced data packet.

The RS encoder/non-systematic RS encoder 123 RS-codes the data randomized by the data randomizer 122 or the data bypassing the data randomizer 122. Then, the RS encoder/non-systematic RS encoder 123 adds a 20-byte RS parity to the coded data, thereby outputting the RS-parity-added data to the data interleaver 124. At this point, if the inputted data correspond to the main data packet, the RS encoder/non-systematic RS encoder 123 performs a systematic RS-coding process identical to that of the conventional broadcasting system on the inputted data, thereby adding the 20-byte RS parity at the end of the 187-byte data. Alternatively, if the inputted data correspond to the enhanced data packet, the 20 bytes of RS parity gained by performing the non-systematic RS-coding are respectively inserted in the decided parity byte places within the enhanced data packet. Herein, the data interleaver 124 corresponds to a byte unit convolutional interleaver. The output of the data interleaver 124 is inputted to the parity byte replacer 125 and the non-systematic RS encoder 126.

Meanwhile, a memory within the trellis encoding module 127, which is positioned after the parity byte replacer 125, should first be initialized in order to allow the output data of the trellis encoding module 127 so as to become the known data defined based upon an agreement between the receiving system and the transmitting system. More specifically, the memory of the trellis encoding module 127 should first be initialized before the known data sequence being inputted is trellis-encoded. At this point, the beginning of the known data sequence that is inputted corresponds to the initialization data place holder inserted by the group formatter 114 and not the actual known data. Therefore, a process of generating initialization data immediately before the trellis-encoding of the known data sequence being inputted and a process of replacing the initialization data place holder of the corresponding trellis encoding module memory with the newly generated initialization data are required.

A value of the trellis memory initialization data is decided based upon the memory status of the trellis encoding module 127, thereby generating the trellis memory initialization data accordingly. Due to the influence of the replace initialization data, a process of recalculating the RS parity, thereby replacing the RS parity outputted from the trellis encoding module 127 with the newly calculated RS parity is required. Accordingly, the non-systematic RS encoder 126 receives the enhanced data packet including the initialization data place holder that is to be replaced with the initialization data from the data interleaver 124 and also receives the initialization data from the trellis encoding module 127. Thereafter, among the received enhanced data packet, the initialization data place holder is replaced with the initialization data. Subsequently, the RS parity data added to the enhanced data packet are removed. Then, a new non-systematic RS parity is calculated and outputted to the parity byte replacer 125. Accordingly, the parity byte replacer 125 selects the output of the data interleaver 124 as the data within the enhanced data packet, and selects the output of the non-systematic RS encoder 126 as the RS parity. Thereafter, the parity byte replacer 125 outputs the selected data.

Meanwhile, if the main data packet is inputted, or if the enhanced data packet that does not include the initialization data place holder that is to be replaced, the parity byte replacer 125 selects the data and RS parity outputted from the data interleaver 124 and directly outputs the selected data to the trellis encoding module 127 without modification. The trellis encoding module 127 converts the byte-unit data to symbol-unit data and 12-way interleaves and trellis-encodes the converted data, which are then outputted to the frame multiplexer 128. The frame multiplexer 128 inserts field synchronization and segment synchronization signals in the output of the trellis encoding module 127 and then outputs the processed data to the transmitting unit 130. Herein, the transmitting unit 130 includes a pilot inserter 131, a modulator 132, and a radio frequency (RF) upconverter 133. The operation of the transmitting unit 130 is identical to the conventional transmitters. Therefore, a detailed description of the same will be omitted for simplicity.

Meanwhile, an odd field and an even field of a field synchronization signal within a transmission frame are alternately transmitted. More specifically, in a field synchronization section having the length of a segment configured of 832 symbols, a data segment synchronization pattern exists in the first 4 symbols, which are then followed by pseudo random sequences PN 511, PN 63, PN 63, and PN 63. The next 24 symbols include information associated with the VSB mode. Herein, among the three PN 63 section, in the second PN 63 section, the symbol (or polarity) is alternated in each field. In other words, '1' becomes '0', and '0' becomes '1'. Accordingly, depending upon the symbol of the second PN 63, a frame may be identified as either an even field or an odd field. Additionally, the 24 symbols that include information associated with the VSB mode are followed by the remaining 104 symbols, which are reserved symbols.

Therefore, in the present invention, by inserting and transmitting known data in a portion of the reserved region or in the entire reserved region, the field synchronization signal may be used more effectively. For example, the known data may be inserted by the frame multiplexer 128. Alternatively, when generating the field synchronization signal, the field synchronization signal may be inputted to the frame multiplexer 128 after allocating the known data to the corresponding reserved region. Furthermore, when inserting the known data in the reserved region of the field synchronization section, in order to allow the receiving system to identify the even and odd fields with more accuracy, the symbol of the known data bytes may be alternately inversed during each field and then inserted. Accordingly, the receiving system may identify the even and odd fields by using the information for identifying the even and odd fields that are inserted in the reserved region (e.g., the symbol of the known data bytes) along with the conventional information for identifying the even and odd fields (e.g., the symbol of the second PN 63). Thus, the accuracy of identifying the even field and the odd field may be enhanced.

Detailed Embodiment

Hereinafter, detailed embodiments of the pre-processor 110 and the packet multiplexer 121 will now be described. According to an embodiment of the present invention, the N value corresponding to the length of a row, which is included in the RS frame that is configured by the RS frame encoder 112, is set to be equal to 538. Accordingly, the RS frame encoder 112 receives 538 transport stream (TS) packets so as to configure a first RS frame having the size of 538*187 bytes. Thereafter, as described above, the first RS frame is processed with a (235,187)-RS encoding process so as to configure a second RS frame having the size of 538*235 bytes. Finally, the second RS frame is processed with generating a 16-bit checksum so as to configure a third RS frame having the sizes of 540*235.

Meanwhile, as shown in FIG. 6, the sum of the number of bytes of the near head (NH) region and the first to fourth body sub-regions (B1 to B4), in which 1/2-rate encoded enhanced data are to be inserted, among the plurality of hierarchical regions within the data group, is equal to 13033 bytes (=2431+2582+2774+2474+2772 bytes). However, since the 1/2 coding rate corresponds to outputting 2 bits when 1 bit is inputted, 1 data byte of the near head (NH) region is set to be a dummy byte so that the number of data byte is set to be a multiple of 2 in order to simplify the allocation of the data byte prior to the 1/2-rate encoding process. More specifically, enhanced data may be inserted in the region of the dummy byte. However, in the present invention, a meaningless (or valueless) null data byte will be inserted. Therefore, a dummy byte region will not be used herein. If one byte of the near head (NH) region is discarded as described above, the group formatter 114 may insert 13032 bytes of the 1/2-rate encoded enhanced data in the near head (NH) region and the first to fourth body sub-regions (B1 to B4). Herein, the number of bytes prior to performing the 1/2-rate encoding process (i.e., prior to byte expansion) is equal to 6516 (=13032/2).

Furthermore, the sum of the number of bytes of the middle head (MH) region and the near tail (NT) region, in which 1/4-rate encoded enhanced data are to be inserted, is equal to 2285 bytes (=933+1352 bytes). However, since the 1/4 coding rate corresponds to outputting 4 bits when 1 bit is inputted, 1 data byte of the middle head (MH) region is set to be a dummy byte so that the number of data byte is set to be a multiple of 4 in order to simplify the allocation of the data byte prior to the 1/4-rate encoding process. If one byte of the middle head (MH) region is discarded as described above, the group formatter 114 may insert 2284 bytes (=932+1352 bytes) of the 1/4-rate encoded enhanced data in the middle head (MH) region and the near tail (NT) region. Herein, the number of bytes prior to performing the 1/4-rate encoding process is equal to 571 (=2284/4).

In other words, when 7087 bytes of enhanced data are inputted to the block processor 113, 6516 bytes are expanded to 13032 bytes by being 1/2-rate encoded, and 571 bytes are expanded to 2284 bytes by being 1/4-rate encoded. Thereafter, the block processor 113 inserts the enhanced data expanded to 13032 bytes in the near head (NH) region and the body region (B1 to B4) and, also, inserts the enhanced data expanded to 2284 bytes in the middle head (MH) region and the near tail (NT) region. Herein, the 7087 bytes of enhanced data being inputted to the block processor 113 may be divided into an output of the RS frame encoder 112 and supplemental information data, such as signaling information. In the present invention, among the 7087 bytes of enhanced data, 7050 bytes correspond to the output of the RS frame encoder 112, and the remaining 37 bytes correspond to the supplemental information data. Then, one of 1/2-rate encoding and 1/4-rate encoding is performed on the corresponding data bytes.

Meanwhile, a RS frame being processed with RS encoding and CRC encoding from the RS frame encoder 112 is configured of 540*235 bytes, in other words, 126900 bytes. The 126900 bytes are divided by 7050-byte units along the time axis, so as to produce 18 7050-byte units. Thereafter, a 37-byte unit of supplemental information data is added to the 7050-byte unit enhanced data being outputted from the RS frame encoder 112. Subsequently, the block processor 113 performs 1/2-rate encoding or 1/4-rate encoding on the corresponding data bytes, which are then outputted to the group formatter 114. Accordingly, the group formatter 114 inserts the 1/2-rate encoded data in the near head (NH) region and the body region (B1 to B4) and the 1/4-rate encoded data in the middle head (MH) region and the near tail (NT) region.

The process of deciding an N value that is required for configuring the RS frame from the RS frame encoder 112 will now be described in detail. More specifically, the size of the final RS frame (i.e., the third RS frame), which is RS encoded and CRC encoded from the RS frame encoder 112, which corresponds to (N+2)*235 bytes should be allocated to X number of groups, wherein X is an integer. Herein, in a single data group, 7050 data bytes prior to being encoded are allocated. Therefore, if the (N+2)*235 bytes are set to be the exact multiple of 7050(=30*235), the output data of the RS frame encoder 112 may be efficiently allocated to the data group. According to an embodiment of the present invention, the value of N is decided so that (N+2) becomes a multiple of 30. For example, in the present invention, N is equal to 538, and (N+2)(=540) divided by 30 is equal to 18. This indicates that the enhanced data within one RS frame are processed with either 1/2-rate encoding or 1/4-rate encoding. The encoded enhanced data are then allocated to 18 data groups.

Figure 8:
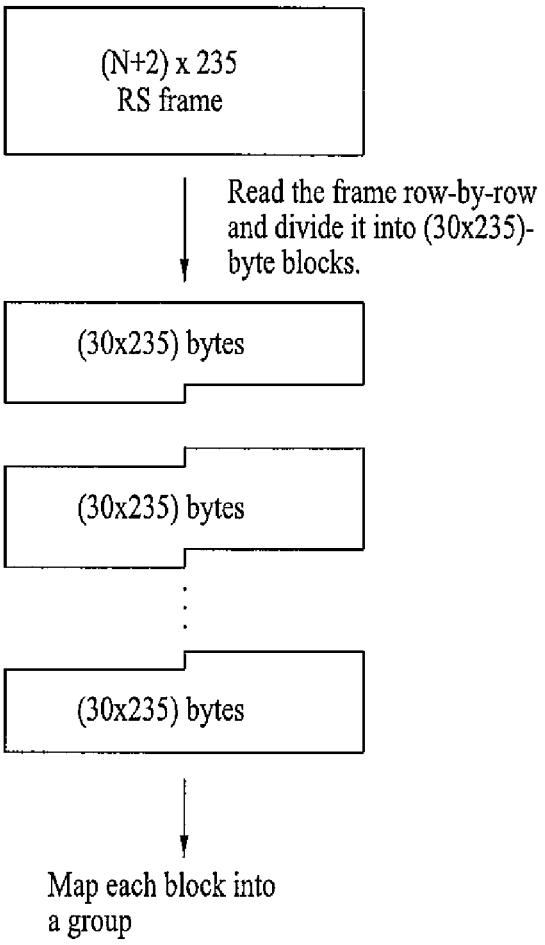
FIG. 8 illustrates an exemplary process of dividing a RS frame in order to configure a data group according to an embodiment of the present invention.

FIG. 8 illustrates a process of dividing the RS frame according to the present invention. More specifically, the RS frame having the size of (N+2)*235 is divided into 30*235 byte blocks. Then, the divided blocks are mapped to a single group. In other words, the data of a block having the size of 30*235 bytes are processed with one of a 1/2-rate encoding process and a 1/4-rate encoding process and are, then, inserted in a data group. Thereafter, the data group having corresponding data and place holders inserted in each hierarchical region divided by the group formatter 114 passes through the data deinterleaver 115 and the packet formatter 116 so as to be inputted to the packet multiplexer 121.

Figure 9:
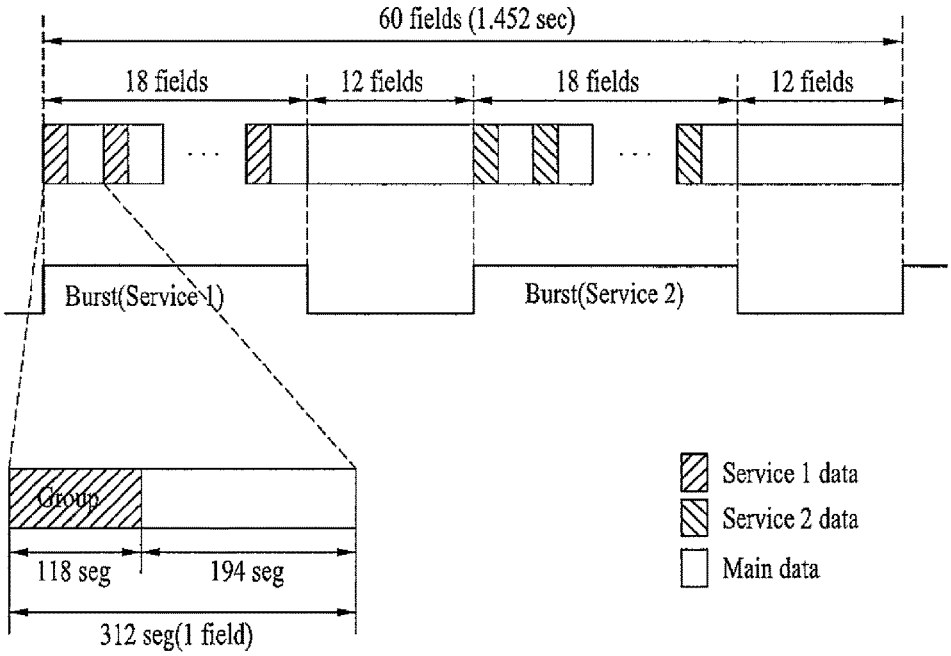
FIG. 9 illustrates exemplary operations of a packet multiplexer for transmitting a data group according to the present invention.

FIG. 9 illustrates exemplary operations of a packet multiplexer for transmitting the data group according to the present invention. More specifically, the packet multiplexer 121 multiplexes a field including a data group, in which the enhanced data and main data are mixed with one another, and a field including only the main data. Thereafter, the packet multiplexer 121 outputs the multiplexed fields to the data randomizer 122. At this point, in order to transmit the RS frame having the size of 540*235 bytes, 18 data groups should be transmitted. Herein, each data group includes field synchronization data, as shown in FIG. 6. Therefore, the 18 data groups are transmitted during 18 field sections, and the section during which the 18 data groups are being transmitted corresponds to a burst section.

In each field within the burst section, a data group including field synchronization data is multiplexed with main data, which are then outputted. For example, in the embodiment of the present invention, in each field within the burst section, a data group having the size of 118 segments is multiplexed with a set of main data having the size of 194 segments. Referring to FIG. 9, during the burst section (i.e., during the 18 field sections), a field including 18 data groups is transmitted. Then, during the following 12 field sections, a field consisting only of the main data is transmitted. Subsequently, during a subsequent burst section (i.e., the following 18 field sections) 18 data groups are included therein and transmitted. Thereafter, a field configured only of the main data is transmitted during the next 12 field sections.

Furthermore, in the present invention, the same type of data service may be provided in the first burst section including the first 18 data groups and in the second burst section including the next 18 data groups. Alternatively, different types of data service may be provided in each burst section. For example, when it is assumed that different data service types are provided to each of the first burst section and the second burst section, shown in FIG. 9, and that the receiving system wishes to receive only one type of data service, the receiving system turns the power on only during the corresponding burst-on section including the desired data service type so as to receive the corresponding 18 data fields. Then, the receiving system turns the power off during the remaining 42 field sections so as to prevent other data service types from being received. Thus, the amount of power consumption of the receiving system may be reduced. In addition, the receiving system according to the present invention is advantageous in that one RS frame may be configured from the 18 data groups that are received during a single burst section.

According to the present invention, the number of data groups included in a burst section may vary based upon the size of the RS frame, and the size of the RS frame varies in accordance with the value N. More specifically, by adjusting the value N, the number of data groups within the burst section may be adjusted. Herein, in an example of the present invention, the (235,187)-RS encoding process adjusts the value N during a fixed state. Furthermore, the size of the enhanced data that can be inserted in the data group may vary based upon the sizes of the trellis initialization data or known data, the MPEG header, and the RS parity, which are inserted in the corresponding data group.

Figure 10:
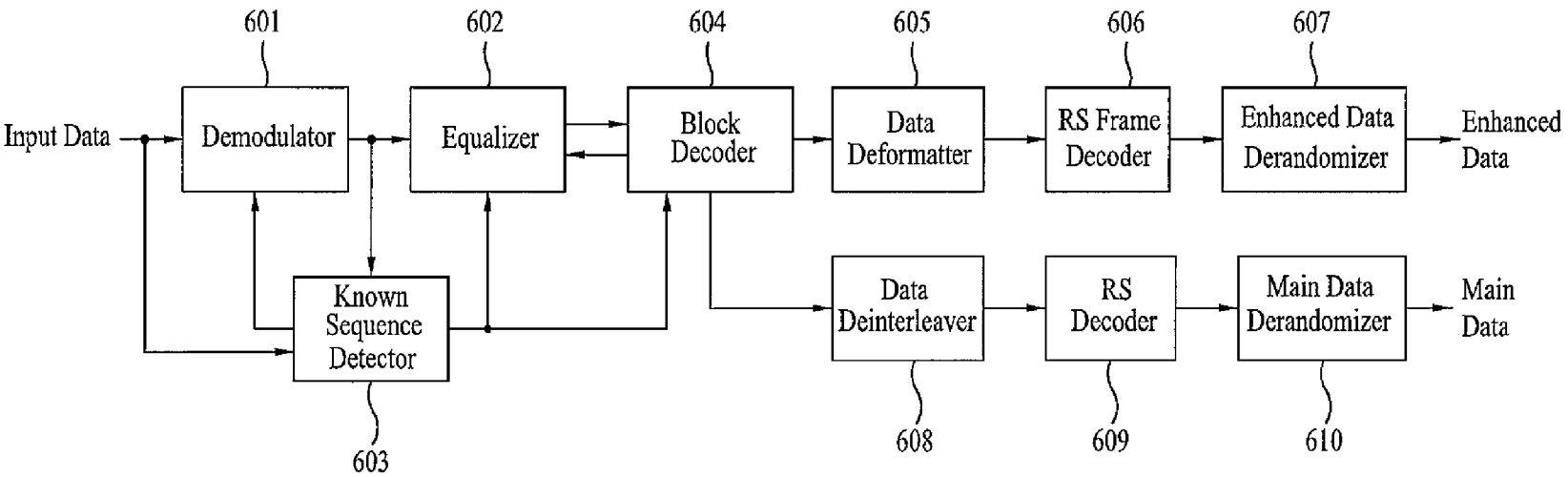
FIG. 10 illustrates a demodulator within a digital broadcast receiving system according to an embodiment of the present invention.

FIG. 10 illustrates a block diagram of a demodulating unit included in the receiving system according to an embodiment of the present invention. Herein, the demodulating unit of FIG. 10 may use known data information being inserted in an enhanced data section and transmitted from the transmitting system so as to perform processes, such as carrier synchronization recovery, frame synchronization recovery, and channel equalization, thereby enhancing the receiving performance. In order to do so, the demodulating unit according to the present invention includes a demodulator 601, a channel equalizer 602, a known sequence detector 603, a block decoder 604, a data deformatter 605, a RS frame decoder 606, an enhanced data derandomizer 607, a data deinterleaver 608, a RS decoder 609, and a main data derandomizer 610. For simplicity, the demodulator 601, the channel equalizer 602, the known sequence detector 603, the block decoder 604, the enhanced data deformatter 605, the RS frame decoder 606, and the enhanced data derandomizer 607 will be referred to as an enhanced data processor. And, the data deinterleaver 608, the RS decoder 609, and the main data derandomizer 610 will be referred to as a main data processor.

More specifically, an IF signal of a particular channel is tuned by a tuner. Then, the tuned IF signal is inputted to the demodulator 601 and the known sequence detector 603. The demodulator 601 performs automatic gain control, carrier recovery, and timing recovery on the IF signal that is being inputted, thereby creating baseband data, which are then outputted to the equalizer 602 and the known sequence detector 603. The equalizer 602 compensates the distortion within the channel included in the demodulated signal. Then, the equalizer 602 outputs the compensated data to the block decoder 604.

At this point, the known sequence detector 603 detects the known data place inserted by the transmitting system to the input/output data of the demodulator 601 (i.e., data prior to demodulation or data after demodulation). Then, along with the position information, the known sequence detector 603 outputs the symbol sequence of the known data generated from the corresponding position to the demodulator 601 and the equalizer 602. Additionally, the known sequence detector 603 outputs information enabling the block decoder 604 to identify the enhanced data being additionally encoded by the transmitting system and the main data that are not additionally encoded to the block decoder 604. Furthermore, although the connection is not shown in FIG. 10, the information detected by the known sequence detector 603 may be used in the overall receiving system and may also be used in the enhanced data formatter 605 and the RS frame decoder 606.

By using the known data symbol sequence when performing the timing recovery or carrier recovery, the demodulating performance of the demodulator 601 may be enhanced. Similarly, by using the known data, the channel equalizing performance of the channel equalizer 602 may be enhanced. Furthermore, by feeding-back the demodulation result of the block demodulator 604, the channel equalizing performance may also be enhanced. Herein, the channel equalizer 602 may perform channel equalization through various methods. In the present invention, a method of estimating a channel impulse response (CIR) for performing the channel equalization process will be given as an example of the present invention. More specifically, in the present invention, the channel impulse response (CIR) is differently estimated and applied in accordance with each hierarchical region within the data group that are transmitted from the transmitting system. Furthermore, by using the known data having the position (or place) and contents pre-known according to an agreement between the transmitting system and the receiving system, so as to estimate the CIR, the channel equalization process may be processed with more stability.

In the present invention, one data group that is inputted for channel equalization is divided into three hierarchical regions: a head region, a body region, and a tail region, as shown in FIG. 6. Then, each of the regions is divided into lower hierarchical regions (or sub-regions). More specifically, the head region may be divided into a far head (FH) region, a middle head (MH) region, and a near head (NH) region. And, the tail region may be divided into a far tail (FT) region and a near tail (NT) region. Furthermore, based upon a long known data sequence, the body region may be divided into 4 lower hierarchical regions: a first lower body (B1) region (or first body sub-region B1), a second lower body (B2) region (or second body sub-region B2), a third lower body (B3) region (or third body sub-region B3), and a fourth lower body (B4) region (or fourth body sub-region B4).

Referring to FIG. 6, the CIR that is estimated from the field synchronization data in the data structure is referred to as CIR_FS. Alternatively, the CIRs that are estimated from each of the 5 known data sequences existing in body region are sequentially referred to as CIR_N0, CIR_N1, CIR_N2, CIR_N3, and CIR_N4. As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(A) of a function F(x) at a particular point A and a value F(B) of the function F(x) at another particular point B are known, interpolation refers to estimating a function value of a point within the section between points A and B. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value F(A) of a function F(x) at a particular point A and a value F(B) of the function F(x) at another particular point B are known, extrapolation refers to estimating a function value of a point outside of the section between points A and B. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

More specifically, in case of the far head (FH) region, any one of the CIR_N4 estimated from a previous data group, the CIR_FS estimated from the current data group that is to be processed with channel equalization, and a new CIR generated by extrapolating the CIR_FS of the current data group and the CIR_N0 may be used to perform channel equalization. Alternatively, in case of the middle head (MH) region, a variety of methods may be applied as described in the case for the far head (FH) region. For example, a new CIR created by linearly extrapolating the CIR_FS estimated from the current data group and the CIR_N0 may be used to perform channel equalization. Also, the CIR_FS estimated from the current data group may also be used to perform channel equalization. Finally, in case of the near head (NH) region, a new CIR may be created by interpolating the CIR_FS estimated from the current data group and CIR_N0, which is then used to perform channel equalization. Furthermore, any one of the CIR_FS estimated from the current data group and CIR_N0 may be used to perform channel equalization.

In case of the body regions B(i), CIR_N(i−1) estimated from the current data group and CIR_N(i) may be interpolated to create a new CIR and use the newly created CIR to perform channel equalization. Also, any one of the CIR_N (i−1) estimated from the current data group and the CIR_N (i) may be used to perform channel equalization. Alternatively, in case of the near tail (NT) region and the fat tail (FT) region, CIR_N3 and CIR_N4 both estimated from the current data group may be extrapolated to create a new CIR, which is then used to perform the channel equalization process. Furthermore, the CIR_N4 estimated from the current data group may be used to perform the channel equalization process. Accordingly, an optimum performance may be obtained when performing channel equalization on the data inserted in the data group. The methods of obtaining the CIRs required for performing the channel equalization process in each region within the data group, as described above, are merely examples given to facilitate the understanding of the present invention. A wider range of methods may also be used herein. And, therefore, the present invention will not only be limited to the examples given in the description set forth herein.

Meanwhile, if the data being inputted to the block decoder 604 after being channel equalized from the equalizer 602 correspond to the enhanced data having additional encoding and trellis encoding processes performed thereon by the transmitting system, trellis decoding and additional decoding processes are performed on the inputted data as inverse processes of the transmitting system. Alternatively, if the data being inputted to the block decoder 604 correspond to the main data having only a trellis encoding process performed thereon, and not the additional encoding process, only the trellis decoding process is performed on the inputted data as the inverse process of the transmitting system. The data group decoded by the block decoder 604 is inputted to the data deformatter 605, and the main data are inputted to the data deinterleaver 608.

More specifically, if the inputted data correspond to the main data, the block decoder 604 performs Viterbi decoding on the inputted data so as to output a hard decision value or to perform a hard-decision on a soft decision value, thereby outputting the result. Meanwhile, if the inputted data correspond to the enhanced data, the block decoder 604 outputs a hard decision value or a soft decision value with respect to the inputted enhanced data. In other words, if the inputted data correspond to the enhanced data, the block decoder 604 performs a decoding process on the data encoded by the block processor and trellis encoding module of the transmitting system.

At this point, the RS frame encoder of the pre-processor included in the transmitting system may be viewed as an external code. And, the block processor and the trellis encoder may be viewed as an internal code. In order to maximize the performance of the external code when decoding such concatenated codes, the decoder of the internal code should output a soft decision value. Therefore, the block decoder 604 may output a hard decision value on the enhanced data. However, when required, it may be more preferable for the block decoder 604 to output a soft decision value.

Meanwhile, the data deinterleaver 608, the RS decoder 609, and the main data derandomizer 610 are blocks required for receiving the main data. Therefore, the above-mentioned blocks may not be required in the structure of a digital broadcast receiving system that only receives the enhanced data. The data deinterleaver 608 performs an inverse process of the data interleaver included in the transmitting system. In other words, the data deinterleaver 608 deinterleaves the main data outputted from the block decoder 604 and outputs the deinterleaved main data to the RS decoder 609. The RS decoder 609 performs a systematic RS decoding process on the deinterleaved data and outputs the processed data to the main data derandomizer 610. The main data derandomizer 610 receives the output of the RS decoder 609 and generates a pseudo random data byte identical to that of the randomizer included in the digital broadcast transmitting system. Thereafter, the main data derandomizer 610 performs a bitwise exclusive OR (XOR) operation on the generated pseudo random data byte, thereby inserting the MPEG synchronization bytes to the beginning of each packet so as to output the data in 188-byte main data packet units.

Meanwhile, the data being outputted from the block decoder 604 to the data deformatter 605 are inputted in the form of a data group. At this point, the data deformatter 605 already knows the structure of the data that are to be inputted and is, therefore, capable of identifying the signaling information, which includes the system information, and the enhanced data from the data group. Thereafter, the data deformatter 605 outputs the identified signaling information to a block requiring system information and outputs the identified enhanced data to the RS frame decoder 606. Herein, the data deformatter 605 removes the known data, trellis initialization data, and MPEG header that have been inserted in the main data and data group from the received data. The data deformatter 605 also removes the RS parity data, which have been inserted by the RS encoder/non-systematic RS encoder or the non-systematic RS encoder of the transmitting system, from the received data. Then, the data deformatter 605 outputs the processed data to the RS frame decoder 606. More specifically, the RS frame decoder 606 receives only the RS encoded and CRC encoded enhanced data that are transmitted from the data deformatter 605.

The RS frame decoder 606 performs an inverse process of the RS frame encoder included in the transmitting system so as to correct the error within the RS frame. Then, the RS frame decoder 606 adds the 1-byte MPEG synchronization data byte, which had been removed during the RS frame encoding process, to the error-corrected enhanced data packet. Thereafter, the processed data packet is outputted to the enhanced data derandomizer 607. The operation of the RS frame decoder 606 will be described in detail in a later process. The enhanced data derandomizer 607 performs a derandomizing process, which corresponds to the inverse process of the randomizer included in the transmitting system, on the received enhanced data. Thereafter, the derandomized data are outputted, thereby obtaining the enhanced data transmitted from the transmitting system. Hereinafter, detailed operations of the RS frame decoder 606 will now be described.

Figure 11:
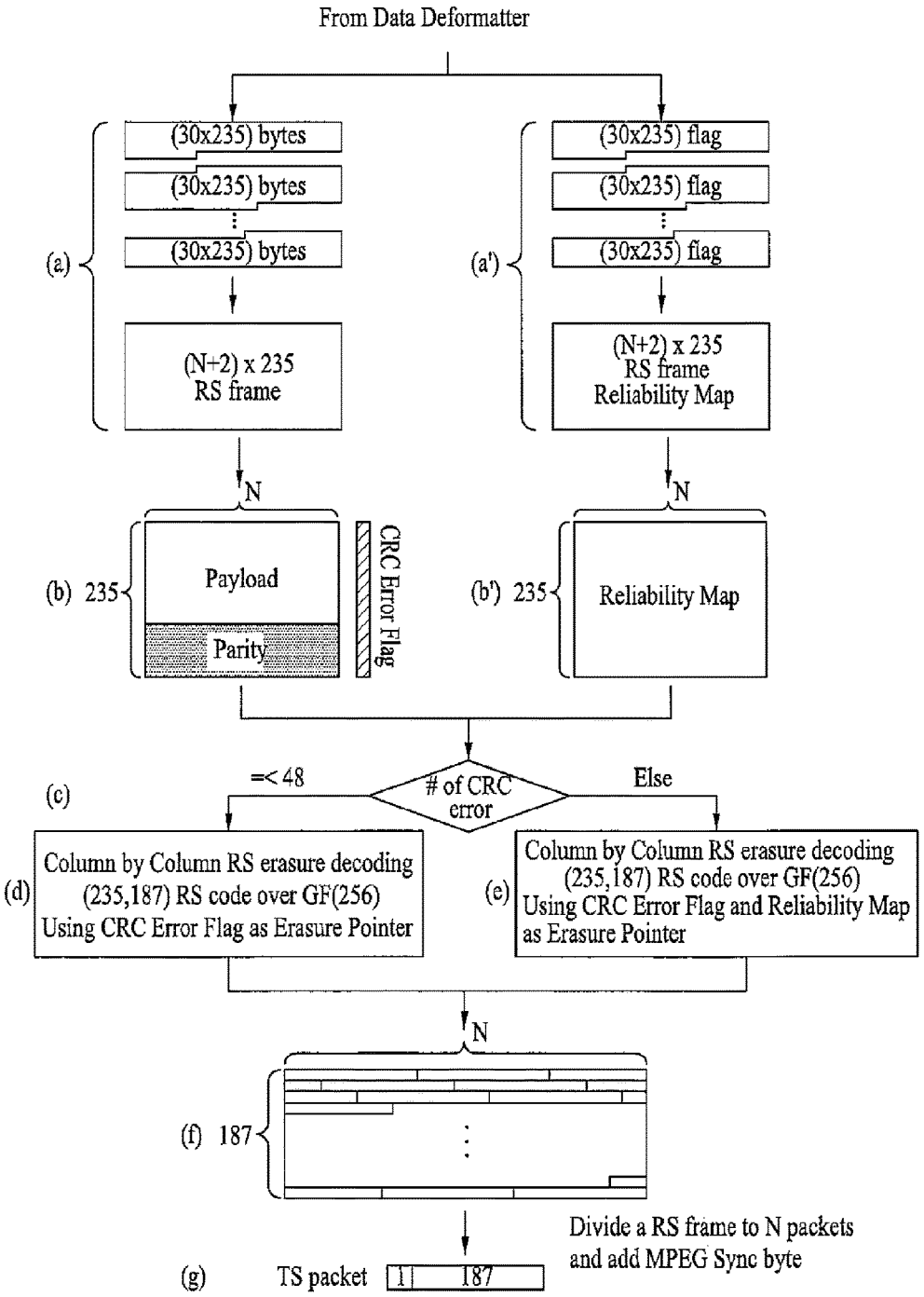
FIG. 11 illustrates an example of an error correction decoding process according to the present invention.

FIG. 11 illustrates a series of exemplary step of an error correction decoding process of the RS frame decoder 606 according to the present invention. More specifically, the RS frame decoder 606 groups enhanced data bytes received from the data deformatter 605 so as to configure a RS frame. The enhanced data correspond to data RS encoded and CRC encoded from the transmitting system. FIG. 11(a) illustrates an example of configuring the RS frame. More specifically, the transmitting system divided the RS frame having the size of (N+2)*235 to 30*235 byte blocks. When it is assumed that each of the divided enhanced data byte blocks is inserted in each data group and then transmitted, the receiving system also groups the 30*235 enhanced data byte blocks respectively inserted in each data group, thereby configuring an RS frame having the size of (N+2)*235. For example, when it is assumed that an RS frame is divided into 18 30*235 byte blocks and transmitted from a burst section, the receiving system also groups the enhanced data bytes of 18 data groups within the corresponding burst section, so as to configure the RS frame. Furthermore, when it is assumed that N is equal to 538 (i.e., N=538), the RS frame decoder 606 may group the enhanced data bytes within the 18 data groups included in a burst so as to configure a RS frame having the size of 540*235 bytes.

Herein, when it is assumed that the block decoder 604 outputs a soft decision value for the decoding result, the RS frame decoder 606 may decide the '0' and '1' of the corresponding bit by using the codes of the soft decision value. 8 bits that are each decided as described above are grouped to create 1 data byte. If the above-described process is performed on all soft decision values of the 18 data groups included in a single burst, the RS frame having the size of 540*235 bytes may be configured. Additionally, the present invention uses the soft decision value not only to configure the RS frame but also to configure a reliability map. Herein, the reliability map indicates the reliability of the corresponding data byte, which is configured by grouping 8 bits, the 8 bits being decided by the codes of the soft decision value.

For example, when the absolute value of the soft decision value exceeds a pre-determined threshold value, the value of the corresponding bit, which is decided by the code of the corresponding soft decision value, is determined to be reliable. Conversely, when the absolute value of the soft decision value does not exceed the pre-determined threshold value, the value of the corresponding bit is determined to be unreliable. Thereafter, if even a single bit among the 8 bits, which are decided by the codes of the soft decision value and group to configure 1 data byte, is determined to be unreliable, the corresponding data byte is marked on the reliability map as an unreliable data byte.

Herein, determining the reliability of 1 data byte is only exemplary. More specifically, when a plurality of data bytes (e.g., at least 4 data bytes) are determined to be unreliable, the corresponding data bytes may also be marked as unreliable data bytes within the reliability map. Conversely, when all of the data bits within the 1 data byte are determined to be reliable (i.e., when the absolute value of the soft decision values of all 8 bits included in the 1 data byte exceed the predetermined threshold value), the corresponding data byte is marked to be a reliable data byte on the reliability map. Similarly, when a plurality of data bytes (e.g., at least 4 data bytes) are determined to be reliable, the corresponding data bytes may also be marked as reliable data bytes within the reliability map. The numbers proposed in the above-described example are merely exemplary and, therefore, do not limit the scope or spirit of the present invention.

The process of configuring the RS frame and the process of configuring the reliability map both using the soft decision value may be performed at the same time. Herein, the reliability information within the reliability map is in a one-to-one correspondence with each byte within the RS frame. For example, if a RS frame has the size of 540*235 bytes, the reliability map is also configured to have the size of 540*235 bytes. FIG. 11(a') illustrates the process steps of configuring the reliability map according to the present invention. Meanwhile, if a RS frame is configured to have the size of (N+2)*235 bytes, the RS frame decoder 606 performs a CRC syndrome checking process on the corresponding RS frame, thereby verifying whether any error has occurred in each row. Subsequently, as shown in FIG. 11(b), a 2-byte checksum is removed to configure an RS frame having the size of N*235 bytes. Herein, the presence (or existence) of an error is indicated on an error flag corresponding to each row. Similarly, since the portion of the reliability map corresponding to the CRC checksum has hardly any applicability, this portion is removed so that only N*235 number of the reliability information bytes remain, as shown in FIG. 11(b').

After performing the CRC syndrome checking process, the RS frame decoder 606 performs RS decoding in a column direction. Herein, a RS erasure correction process may be performed in accordance with the number of CRC error flags. More specifically, as shown in FIG. 11(c), the CRC error flag corresponding to each row within the RS frame is verified. Thereafter, the RS frame decoder 606 determines whether the number of rows having a CRC error occurring therein is equal to or smaller than the maximum number of errors on which the RS erasure correction may be performed, when performing the RS decoding process in a column direction. The maximum number of errors corresponds to a number of parity bytes inserted when performing the RS encoding process. In the embodiment of the present invention, it is assumed that 48 parity bytes have been added to each column.

If the number of rows having the CRC errors occurring therein is smaller than or equal to the maximum number of errors (i.e., 48 errors according to this embodiment) that can be corrected by the RS erasure decoding process, a (235, 187)-RS erasure decoding process is performed in a column direction on the RS frame having 235 N-byte rows, as shown in FIG. 11(d). Thereafter, as shown in FIG. 11(f), the 48-byte parity data that have been added at the end of each column are removed. Conversely, however, if the number of rows having the CRC errors occurring therein is greater than the maximum number of errors (i.e., 48 errors) that can be corrected by the RS erasure decoding process, the RS erasure decoding process cannot be performed. In this case, the error may be corrected by performing a general RS decoding process. In addition, the reliability map, which has been created based upon the soft decision value along with the RS frame, may be used to further enhance the error correction ability (or performance) of the present invention.

More specifically, the RS frame decoder 606 compares the absolute value of the soft decision value of the block decoder 604 with the pre-determined threshold value, so as to determine the reliability of the bit value decided by the code of the corresponding soft decision value. Also, 8 bits, each being determined by the code of the soft decision value, are grouped to form 1 data byte. Accordingly, the reliability information on this 1 data byte is indicated on the reliability map. Therefore, as shown in FIG. 11(e), even though a particular row is determined to have an error occurring therein based upon a CRC syndrome checking process on the particular row, the present invention does not assume that all bytes included in the row have errors occurring therein. The present invention refers to the reliability information of the reliability map and sets only the bytes that have been determined to be unreliable as erroneous bytes. In other words, with disregard to whether or not a CRC error exists within the corresponding row, only the bytes that are determined to be unreliable based upon the reliability map are set as erasure points.

According to another method, when it is determined that CRC errors are included in the corresponding row, based upon the result of the CRC syndrome checking result, only the bytes that are determined by the reliability map to be unreliable are set as errors. More specifically, only the bytes corresponding to the row that is determined to have errors included therein and being determined to be unreliable based upon the reliability information, are set as the erasure points. Thereafter, if the number of error points for each column is smaller than or equal to the maximum number of errors (i.e., 48 errors) that can be corrected by the RS erasure decoding process, an RS erasure decoding process is performed on the corresponding column. Conversely, if the number of error points for each column is greater than the maximum number of errors (i.e., 48 errors) that can be corrected by the RS erasure decoding process, a general decoding process is performed on the corresponding column.

More specifically, if the number of rows having CRC errors included therein is greater than the maximum number of errors (i.e., 48 errors) that can be corrected by the RS erasure decoding process, either an RS erasure decoding process or a general RS decoding process is performed on a column that is decided based upon the reliability information of the reliability map, in accordance with the number of erasure points within the corresponding column. For example, it is assumed that the number of rows having CRC errors included therein within the RS frame is greater than 48. And, it is also assumed that the number of erasure points decided based upon the reliability information of the reliability map is indicated as 40 erasure points in the first column and as erasure points in the second column. In this case, a (235,187)-RS erasure decoding process is performed on the first column. Alternatively, a (235,187)-RS decoding process is performed on the second column. When error correction decoding is performed on all column directions within the RS frame by using the above-described process, the 48-byte parity data which were added at the end of each column are removed, as shown in FIG. 11(f).

As described above, even though the total number of CRC errors corresponding to each row within the RS frame is greater than the maximum number of errors that can be corrected by the RS erasure decoding process, when the number of bytes determined to have a low reliability level, based upon the reliability information on the reliability map within a particular column, while performing error correction decoding on the particular column. Herein, the difference between the general RS decoding process and the RS erasure decoding process is the number of errors that can be corrected. More specifically, when performing the general RS decoding process, the number of errors corresponding to half of the number of parity bytes (i.e., (number of parity bytes)/2) that are inserted during the RS encoding process may be error corrected (e.g., 24 errors may be corrected). Alternatively, when performing the RS erasure decoding process, the number of errors corresponding to the number of parity bytes that are inserted during the RS encoding process may be error corrected (e.g., 48 errors may be corrected).

After performing the error correction decoding process, as described above, a RS frame configured of 187 N-byte rows (or packets) maybe obtained, as shown in FIG. 11(f). Furthermore, the RS frame having the size of N*187 bytes is sequentially outputted in N number of 187-byte units. Herein, as shown in FIG. 11(g), the 1-byte MPEG synchronization byte that was removed by the transmitting system is added at the end of each 187-byte packet, thereby outputting 188-byte enhanced data packets.

Figure 12:
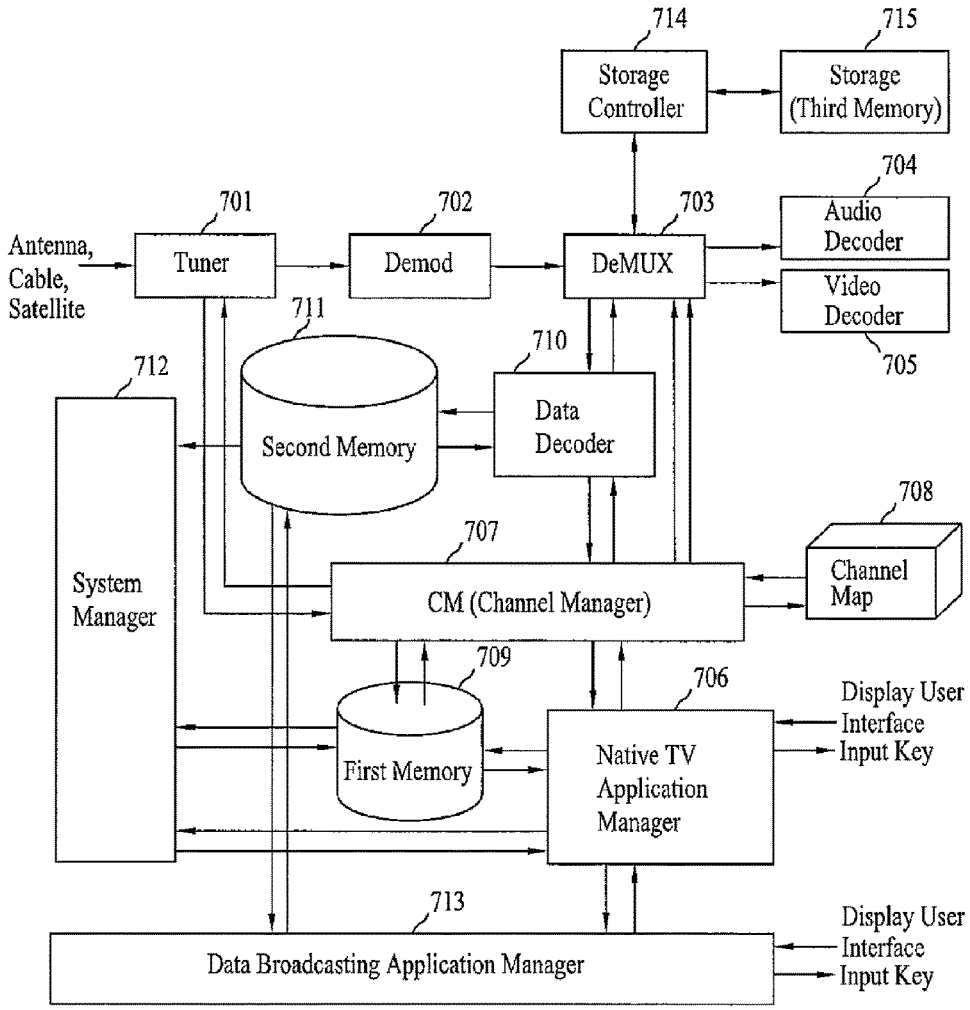
FIG. 12 illustrates a block diagram showing a structure of a digital broadcast receiving system according to an embodiment of the present invention.

FIG. 12 illustrates a block diagram showing the structure of a digital broadcast receiving system according to an embodiment of the present invention. Referring to FIG. 12, the digital broadcast receiving system includes a tuner 701, a demodulating unit 702, a demultiplexer 703, an audio decoder 704, a video decoder 705, a native TV application manager 706, a channel manager 707, a channel map 708, a first memory 709, a data decoder 710, a second memory 711, a system manager 712, a data broadcasting application manager 713, a storage controller 714, and a third memory 715. Herein, the third memory 715 is a mass storage device, such as a hard disk drive (HDD) or a memory chip. The tuner 701 tunes a frequency of a specific channel through any one of an antenna, cable, and satellite. Then, the tuner 701 down-converts the tuned frequency to an intermediate frequency (IF), which is then outputted to the demodulating unit 702. At this point, the tuner 701 is controlled by the channel manager 707. Additionally, the result and strength of the broadcast signal of the tuned channel are also reported to the channel manager 707. The data that are being received by the frequency of the tuned specific channel include main data, enhanced data, and table data for decoding the main data and enhanced data.

In the embodiment of the present invention, examples of the enhanced data may include data provided for data service, such as Java application data, HTML application data, XML data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the enhanced data may correspond to meta data. For example, the meta data use the XML application so as to be transmitted through a DSM-CC protocol.

The demodulating unit 702 performs demodulation and channel equalization on the signal being outputted from the tuner 701, thereby identifying the main data and the enhanced data. Thereafter, the identified main data and enhanced data are outputted in TS packet units. An example of the demodulating unit 702 is shown in FIG. 10. The demodulating unit shown in FIG. 10 is merely exemplary and the scope of the present invention is not limited to the examples set forth herein. In the embodiment given as an example of the present invention, only the enhanced data packet outputted from the demodulating unit 702 is inputted to the demultiplexer 703. In this case, the main data packet is inputted to another demultiplexer (not shown) that processes main data packets. Herein, the storage controller 714 is also connected to the other demultiplexer in order to store the main data after processing the main data packets. The demultiplexer of the present invention may also be designed to process both enhanced data packets and main data packets in a single demultiplexer.

The storage controller 714 is interfaced with the demultipelxer so as to control instant recording, reserved (or preprogrammed) recording, time shift, and so on of the enhanced data and/or main data. For example, when one of instant recording, reserved (or pre-programmed) recording, and time shift is set and programmed in the receiving system (or receiver) shown in FIG. 12, the corresponding enhanced data and/or main data that are inputted to the demultiplexer are stored in the third memory 715 in accordance with the control of the storage controller 714. The third memory 715 may be described as a temporary storage area and/or a permanent storage area. Herein, the temporary storage area is used for the time shifting function, and the permanent storage area is used for a permanent storage of data according to the user's choice (or decision).

When the data stored in the third memory 715 need to be reproduced (or played), the storage controller 714 reads the corresponding data stored in the third memory 715 and outputs the read data to the corresponding demultiplexer (e.g., the enhanced data are outputted to the demultiplexer 703 shown in FIG. 12). At this point, according to the embodiment of the present invention, since the storage capacity of the third memory 715 is limited, the compression encoded enhanced data and/or main data that are being inputted are directly stored in the third memory 715 without any modification for the efficiency of the storage capacity. In this case, depending upon the reproduction (or reading) command, the data read from the third memory 715 pass trough the demultiplexer so as to be inputted to the corresponding decoder, thereby being restored to the initial state.

The storage controller 714 may control the reproduction (or play), fast-forward, rewind, slow motion, instant replay functions of the data that are already stored in the third memory 715 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function. If the data being inputted correspond to the analog format, for example, if the transmission mode is NTSC, PAL, and so on, the storage controller 714 compression encodes the inputted data and stored the compression-encoded data to the third memory 715. In order to do so, the storage controller 714 may include an encoder, wherein the encoder may be embodied as one of software, middleware, and hardware. Herein, an MPEG encoder may be used as the encoder according to an embodiment of the present invention. The encoder may also be provided outside of the storage controller 714.

Meanwhile, in order to prevent illegal duplication (or copies) of the input data being stored in the third memory 715, the storage controller 714 scrambles the input data and stores the scrambled data in the third memory 715. Accordingly, the storage controller 714 may include a scramble algorithm for scrambling the data stored in the third memory 715 and a descramble algorithm for descrambling the data read from the third memory 715. Herein, the definition of scramble includes encryption, and the definition of descramble includes decryption. The scramble method may include using an arbitrary key (e.g., control word) to modify a desired set of data, and also a method of mixing signals.

Meanwhile, the demultiplexer 703 receives the real-time data outputted from the demodulating unit 702 or the data read from the third memory 715 and demultiplexes the received data. In the example given in the present invention, the demultiplexer 703 performs demultiplexing on the enhanced data packet. Therefore, in the present invention, the receiving and processing of the enhanced data will be described in detail. It should also be noted that a detailed description of the processing of the main data will be omitted for simplicity starting from the description of the demultiplexer 703 and the subsequent elements.

The demultiplexer 703 demultiplexes enhanced data and program specific information/program and system information protocol (PSI/PSIP) tables from the enhanced data packet inputted in accordance with the control of the data decoder 710. Thereafter, the demultiplexed enhanced data and PSI/PSIP tables are outputted to the data decoder 710 in a section format. In order to extract the enhanced data from the channel through which enhanced data are transmitted and to decode the extracted enhanced data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and the channel number. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.). The DCCT/DCCSCT transmits information associated with automatic (or direct) channel change. And, the MGT transmits the versions and PID information of the above-mentioned tables included in the PSIP.

Each of the above-described tables included in the PSI/PSIP is configured of a basic unit referred to as a "section" and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PSIP, or a combination of tables included in both the PSI and the PSIP. In order to parse and decode the data for the data service, at least one of the PAT and PMT included in the PSI, and the VCT included in the PSIP is required. For example, the PAT may include the system information for transmitting the data corresponding to the data service, and the PID of the PMT corresponding to the data service data (or program number). The PMT may include the PID of the TS packet used for transmitting the data service data. The VCT may include information on the virtual channel for transmitting the data service data, and the PID of the TS packet for transmitting the data service data.

Meanwhile, depending upon the embodiment of the present invention, a DVB-SI may be applied instead of the PSIP. The DVB-SI may include a network information table (NIT), a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information that is used during the IRD set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT), a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, the enhanced data included in the payload within the TS packet consist of a digital storage media-command and control (DSM-CC) section format. However, the TS packet including the data service data may correspond either to a packetized elementary stream (PES) type or to a section type. More specifically, either the PES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST). When transmitting the DST, '0x95'? is assigned as the value of a stream type field included in the service location descriptor of the PMT or the VCT. More specifically, when the PMT or VCT stream type field value is '0x95', the receiving system may acknowledge that data broadcasting including enhanced data (i.e., the enhanced data) is being received. At this point, the enhanced data may be transmitted by a data carousel method. The data carousel method corresponds to repeatedly transmitting identical data on a regular basis.

At this point, according to the control of the data decoder 710, the demultiplexer 703 performs section filtering, thereby discarding repetitive sections and outputting only the non-repetitive sections to the data decoder 710. The demultiplexer 703 may also output only the sections configuring desired tables (e.g., VCT) to the data decoder 710 by section filtering. Herein, the VCT may include a specific descriptor for the enhanced data. However, the present invention does not exclude the possibilities of the enhanced data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 703 performs the section filtering process by referring to a table_id field, a version_number field, a section_number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PID, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PID must be previously made between the transmitting system and the receiving system.

Meanwhile, in the embodiment of the present invention, the demultiplexer 703 may output only an application information table (AIT) to the data decoder 710 by section filtering. The AIT includes information on an application being operated in the receiving system for the data service. The AIT may also be referred to as an XAIT, and an AMT. Therefore, any table including application information may correspond to the following description. When the AIT is transmitted, a value of '0x05' may be assigned to a stream type field of the PMT. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon.

In the method for detecting application information for the data service by using the AIT, component_tag, original_network_id, transport_stream_id, and service_id fields may be used for detecting the application information. The component_tag field designates an elementary stream carrying a DSI of a corresponding object carousel. The original_network_id field indicates a DVB-SI original_network_id of the TS providing transport connection. The transport_stream_id field indicates the MPEG TS of the TS providing transport connection, and the service_id field indicates the DVB-SI of the service providing transport connection. Information on a specific channel may be obtained by using the original_network_id field, the transport_stream_id field, and the service_id field. The data service data, such as the application data, detected by using the above-described method may be stored in the second memory 711 by the data decoder 710.

The data decoder 710 parses the DSM-CC section configuring the demultiplexed enhanced data. Then, the enhanced data corresponding to the parsed result are stored as a database in the second memory 711. The data decoder 710 groups a plurality of sections having the same table identification (table_id) so as to configure a table, which is then parsed. Thereafter, the parsed result is stored as a database in the second memory 711. At this point, by parsing data and/or sections, the data decoder 710 reads all of the remaining actual section data that are not section-filtered by the demultiplexer 703. Then, the data decoder 710 stores the read data to the second memory 711. The second memory 711 corresponds to a table and data carousel database storing system information parsed from tables and enhanced data parsed from the DSM-CC section. Herein, a table_id field, a section_number field, and a last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT.

When the VCT is parsed, information on the virtual channel to which enhanced data are transmitted may be obtained. The obtained application identification information, service component identification information, and service information corresponding to the data service may either be stored in the second memory 711 or be outputted to the data broadcasting application manager 713. In addition, reference may be made to the application identification information, service component identification information, and service information in order to decode the data service data. Alternatively, such information may also prepare the operation of the application program for the data service. Furthermore, the data decoder 710 controls the demultiplexing of the system information table, which corresponds to the information table associated with the channel and events. Thereafter, an A.V PID list may be transmitted to the channel manager 707.

The channel manager 707 may refer to the channel map 708 in order to transmit a request for receiving system-related information data to the data decoder 710, thereby receiving the corresponding result. In addition, the channel manager 707 may also control the channel tuning of the tuner 701. Furthermore, the channel manager 707 may directly control the demultiplexer 703, so as to set up the A/V PID, thereby controlling the audio decoder 704 and the video decoder 705. The audio decoder 704 and the video decoder 705 may respectively decode and output the audio data and video data demultiplexed from the main data packet. Alternatively, the audio decoder 704 and the video decoder 705 may respectively decode and output the audio data and video data demultiplexed from the enhanced data packet. Meanwhile, when the enhanced data include data service data, and also audio data and video data, it is apparent that the audio data and video data demultiplexed by the demultiplexer 703 are respectively decoded by the audio decoder 704 and the video decoder 705. For example, an audio-coding (AC)-3 decoding algorithm may be applied to the audio decoder 704, and a MPEG-2 decoding algorithm may be applied to the video decoder 705.

Meanwhile, the native TV application manager 706 operates a native application program stored in the first memory 709, thereby performing general functions such as channel change. The native application program refers to software stored in the receiving system upon shipping of the product. More specifically, when a user request (or command) is transmitted to the receiving system through a user interface (UI), the native TV application manger 706 displays the user request on a screen through a graphic user interface (GUI), thereby responding to the user's request. The user interface receives the user request through an input device, such as a remote controller, a key pad, a jog controller, an a touch-screen provided on the screen, and then outputs the received user request to the native TV application manager 706 and the data broadcasting application manager 713. Furthermore, the native TV application manager 706 controls the channel manager 707, thereby controlling channel-associated, such as the management of the channel map 708, and controlling the data decoder 710. The native TV application manager 706 also controls the GUI of the overall receiving system, thereby storing the user request and status of the receiving system in the first memory 709 and restoring the stored information.

The channel manager 707 controls the tuner 701 and the data decoder 710, so as to managing the channel map 708 so that it can respond to the channel request made by the user. More specifically, channel manager 707 sends a request to the data decoder 710 so that the tables associated with the channels that are to be tuned are parsed. The results of the parsed tables are reported to the channel manager 707 by the data decoder 710. Thereafter, based on the parsed results, the channel manager 707 updates the channel map 708 and sets up a PID in the demultiplexer 703 for demultiplexing the tables associated with the data service data from the enhanced data.

The system manager 712 controls the booting of the receiving system by turning the power on or off. Then, the system manager 712 stores ROM images (including downloaded software images) in the first memory 709. More specifically, the first memory 709 stores management programs such as operating system (OS) programs required for managing the receiving system and also application program executing data service functions. The application program is a program processing the data service data stored in the second memory 711 so as to provide the user with the data service. If the data service data are stored in the second memory 711, the corresponding data service data are processed by the above-described application program or by other application programs, thereby being provided to the user. The management program and application program stored in the first memory 709 may be updated or corrected to a newly downloaded program. Furthermore, the storage of the stored management program and application program is maintained without being deleted even if the power of the system is shut down. Therefore, when the power is supplied the programs may be executed without having to be newly downloaded once again.

The application program for providing data service according to the present invention may either be initially stored in the first memory 709 upon the shipping of the receiving system, or be stored in the first 709 after being downloaded. The application program for the data service (i.e., the data service providing application program) stored in the first memory 709 may also be deleted, updated, and corrected. Furthermore, the data service providing application program may be downloaded and executed along with the data service data each time the data service data are being received.

When a data service request is transmitted through the user interface, the data broadcasting application manager 713 operates the corresponding application program stored in the first memory 709 so as to process the requested data, thereby providing the user with the requested data service. And, in order to provide such data service, the data broadcasting application manager 713 supports the graphic user interface (GUI). Herein, the data service may be provided in the form of text (or short message service (SMS)), voice message, still image, and moving image. The data broadcasting application manager 713 may be provided with a platform for executing the application program stored in the first memory 709. The platform may be, for example, a Java virtual machine for executing the Java program. Hereinafter, an example of the data broadcasting application manager 713 executing the data service providing application program stored in the first memory 709, so as to process the data service data stored in the second memory 711, thereby providing the user with the corresponding data service will now be described in detail.

Assuming that the data service corresponds to a traffic information service, the data service according to the present invention is provided to the user of a receiving system that is not equipped with an electronic map and/or a GPS system in the form of at least one of a text (or short message service (SMS)), a voice message, a graphic message, a still image, and a moving image. In this case, is a GPS module is mounted on the receiving system shown in FIG. 12, the GPS module receives satellite signals transmitted from a plurality of low earth orbit satellites and extracts the current position (or location) information (e.g., longitude, latitude, altitude), thereby outputting the extracted information to the data broadcasting application manager 713.

At this point, it is assumed that the electronic map including information on each link and nod and other diverse graphic information are stored in one of the second memory 711, the first memory 709, and another memory that is not shown. More specifically, according to the request made by the data broadcasting application manager 713, the data service data stored in the second memory 711 are read and inputted to the data broadcasting application manager 713. The data broadcasting application manager 713 translates (or deciphers) the data service data read from the second memory 711, thereby extracting the necessary information according to the contents of the message and/or a control signal.

Figure 13:
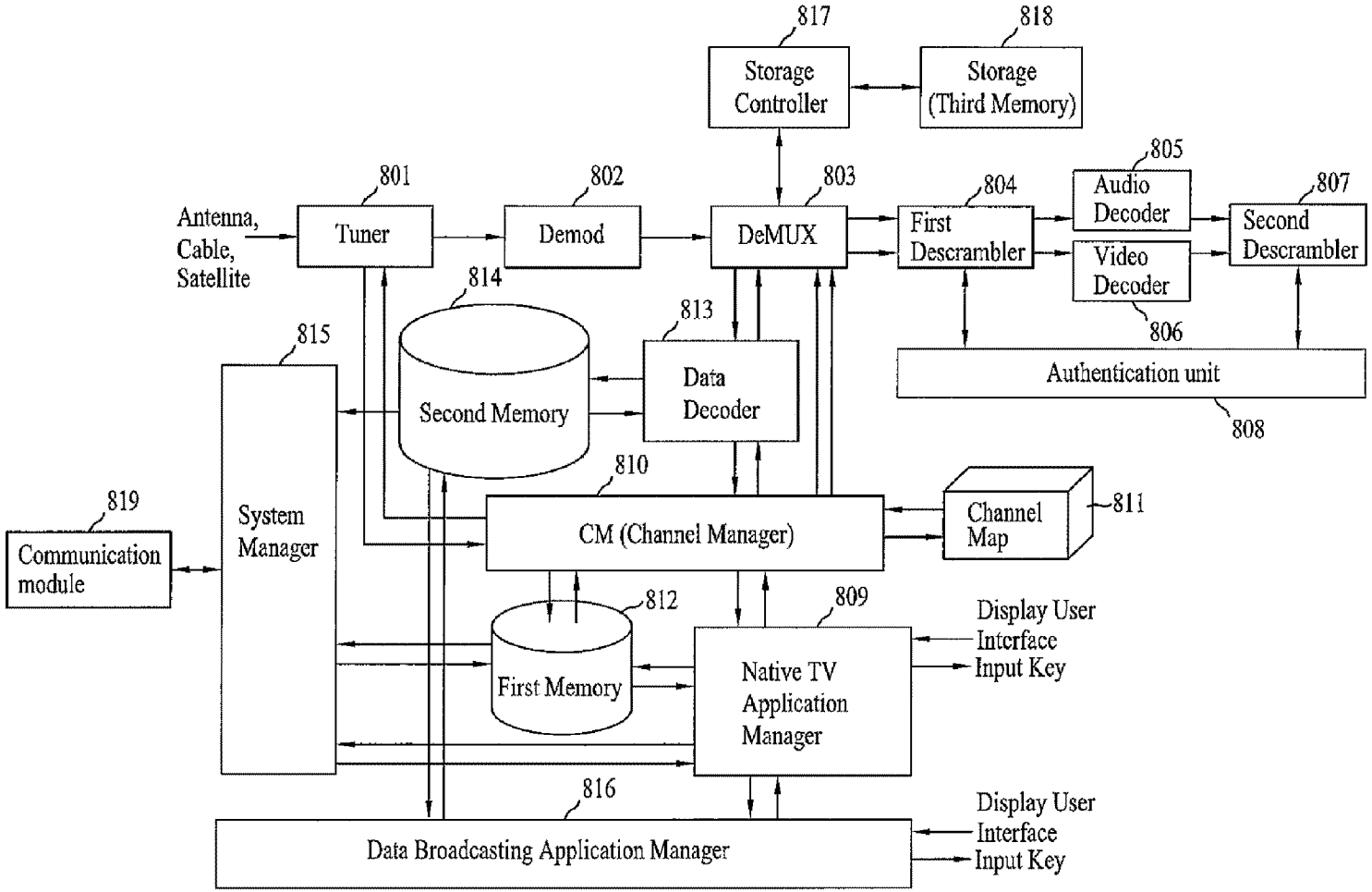
FIG. 13 illustrates a block diagram showing a structure of a digital broadcast receiving system according to another embodiment of the present invention.

FIG. 13 illustrates a block diagram showing the structure of a digital broadcast (or television) receiving system according to another embodiment of the present invention. Referring to FIG. 13, the digital broadcast receiving system includes a tuner 801, a demodulating unit 802, a demultiplexer 803, a first descrambler 804, an audio decoder 805, a video decoder 806, a second descrambler 807, an authentication unit 808, a native TV application manager 809, a channel manager 810, a channel map 811, a first memory 812, a data decoder 813, a second memory 814, a system manager 815, a data broadcasting application manager 816, a storage controller 817, a third memory 818, and a telecommunication module 819. Herein, the third memory 818 is a mass storage device, such as a hard disk drive (HDD) or a memory chip. Also, during the description of the digital broadcast (or television or DTV) receiving system shown in FIG. 13, the components that are identical to those of the digital broadcast receiving system of FIG. 12 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descramble the scrambled broadcast contents in order to provide the user with the proper broadcast contents. Furthermore, the receiving system may generally be processed with an authentication process with an authentication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating (or verifying) whether the receiving system is entitled to receive the descrambled contents. Hereinafter, the descrambling means will be referred to as first and second descramblers 804 and 807, and the authentication means will be referred to as an authentication unit 808. Such naming of the corresponding components is merely exemplary and is not limited to the terms suggested in the description of the present invention. For example, the units may also be referred to as a decryptor. Although FIG. 13 illustrates an example of the descramblers 804 and 807 and the authentication unit 808 being provided inside the receiving system, each of the descramblers 804 and 807 and the authentication unit 808 may also be separately provided in an internal or external module. Herein, the module may include a slot type, such as a SD or CF memory, a memory stick type, a USB type, and so on, and may be detachably fixed to the receiving system.

As described above, when the authentication process is performed successfully by the authentication unit 808, the scrambled broadcasting contents are descrambled by the descramblers 804 and 807, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 808 and the descramblers 804 and 807 will now be described in detail. The receiving system receives the scrambled broadcasting contents through the tuner 801 and the demodulating unit 802. Then, the system manager 815 decides whether the received broadcasting contents have been scrambled. Herein, the demodulating unit 802 may be included as a demodulating means according to embodiment of the present invention as described in FIG. 10. However, the present invention is not limited to the examples given in the description set forth herein. If the system manager 815 decides that the received broadcasting contents have been scrambled, then the system manager 815 controls the system to operate the authentication unit 808. As described above, the authentication unit 808 performs an authentication process in order to decide whether the receiving system according to the present invention corresponds to a legitimate host entitled to receive the paid broadcasting service. Herein, the authentication process may vary in accordance with the authentication methods.

For example, the authentication unit 808 may perform the authentication process by comparing an IP address of an IP datagram within the received broadcasting contents with a specific address of a corresponding host. At this point, the specific address of the corresponding receiving system (or host) may be a MAC address. More specifically, the authentication unit 808 may extract the IP address from the decapsulated IP datagram, thereby obtaining the receiving system information that is mapped with the IP address. At this point, the receiving system should be provided, in advance, with information (e.g., a table format) that can map the IP address and the receiving system information. Accordingly, the authentication unit 808 performs the authentication process by determining the conformity between the address of the corresponding receiving system and the system information of the receiving system that is mapped with the IP address. In other words, if the authentication unit 808 determines that the two types of information conform to one another, then the authentication unit 808 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system determines whether the received identification information conforms with its own unique identification number, so as to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the CAS information, mode information, message position information, that are applied to the scrambling of the broadcasting contents are transmitted through a corresponding data header or another data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiving system-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 808 of the receiving system extracts the identification information of the receiving system and the identification information included in the EMM of the broadcasting service that is being received. Then, the authentication unit 808 determines whether the identification information conform to each other, so as to perform the authentication process. More specifically, if the authentication unit 808 determines that the information conform to each other, then the authentication unit 808 eventually determines that the receiving system is entitled to receive the request broadcasting service.

In yet another example, the authentication unit 808 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 815 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted IDs to the transmitting system. Thus, the transmitting system may use the transmitted ID values as information determining whether to start the requested service or as payment information. Whenever necessary, the system manager 815 transmits the payment information to the remote transmitting system through the telecommunication module 819.

The authentication unit 808 authenticates the corresponding receiving system and/or the external module. Then, if the authentication process is successfully completed, the authentication unit 808 certifies the corresponding receiving system and/or the external module as a legitimate system and/or module entitled to receive the requested paid broadcasting service. In addition, the authentication unit 808 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 808, the receiving system may descramble the scrambled broadcasting contents received from the transmitting system. At this point, the descrambling process is performed by the first and second descramblers 804 and 807. Herein, the first and second descramblers 804 and 807 may be included in an internal module or an external module of the receiving system.

The receiving system is also provided with a common interface for communicating with the external module including the first and second descramblers 804 and 807, so as to perform the descrambling process. More specifically, the first and second descramblers 804 and 807 may be included in the module or in the receiving system in the form of hardware, middleware or software. Herein, the descramblers 804 and 807 may be included in any one of or both of the module and the receiving system. If the first and second descramblers 804 and 807 are provided inside the receiving system, it is advantageous to have the transmitting system (i.e., at least any one of a service provider and a broadcast station) scramble the corresponding data using the same scrambling method.

Alternatively, if the first and second descramblers 804 and 807 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide CA functions, which are uniquely and only provided by each transmitting systems, and functions related to each service that is to be provided to the user. The common interface enables the various external modules and the system manager 815, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advanced is inserted in the receiving system, the receiving system receives and loads the CAS software from the memory card so as to perform the authentication process. In this example, the CAS software is read out from the memory card and stored in the first memory 812 of the receiving system. Thereafter, the CAS software is operated in the receiving system as an application program. According to an embodiment of the present invention, the CAS software is mounted on (or stored) in a middleware platform and, then executed. A Java middleware will be given as an example of the middleware included in the present invention. Herein, the CAS software should at least include information required for the authentication process and also information required for the descrambling process.

Therefore, the authentication unit 808 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 808 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 815, then the memory card is verified and determined to be a normal memory card that may be used in the receiving system. At this point, the CAS software may either be installed in the first memory 812 upon the shipping of the present invention, or be downloaded to the first memory 812 from the transmitting system or the module or memory card, as described above. Herein, the descrambling function may be operated by the data broadcasting application manger 816 as an application program.

Thereafter, the CAS software parses the EMM/ECM packets outputted from the demultiplexer 803, so as to verify whether the receiving system is entitled to receive the corresponding data, thereby obtaining the information required for descrambling (i.e., the CW) and providing the obtained CW to the descramblers 804 and 807. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 804 and 807. Each of the descramblers 804 and 807 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system so as to upgrade (or update) the CAS software originally stored in the memory card. As described above, regardless of the type of broadcast receiving system, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on CAS manufacturers. Accordingly, fabrication costs of CAS equipments and management systems may also be minimized.

Meanwhile, the descramblers 804 and 807 may be included in the module either in the form of hardware or in the form of software. In this case, the scrambled data that being received are descrambled by the module and then demodulated. Also, if the scrambled data that are being received are stored in the third memory 818, the received data may be descrambled and then stored, or stored in the memory at the point of being received and then descrambled later on prior to being played (or reproduced). Thereafter, in case scramble/descramble algorithms are provided in the storage controller 817, the storage controller 817 scrambles the data that are being received once again and then stores the re-scrambled data to the third memory 818.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 819. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 819 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information). Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 819 may also be configured. Also, the PDU may be configured in the Java application of the receiving system and then outputted to the telecommunication module 819. The PDU may also be configured by transmitting the tag value, the actual data that are to be transmitted, the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a WAP, CDMA 1×EV-DO, which can be connected through a mobile telecommunication base station, such as CDMA and GSM, and also provided with a wireless LAN, mobile internet, WiBro, WiMax, which can be connected through an access point. The above-described receiving system corresponds to the system that is not equipped with a telecommunication function. However, a receiving system equipped with telecommunication function does not require the telecommunication module 819.

The broadcasting data being transmitted and received through the above-described wireless data network may include data required for performing the function of limiting data reception. Meanwhile, the demultiplexer 803 receives either the real-time data outputted from the demodulating unit 802 or the data read from the third memory 818, thereby performing demultiplexing. In this embodiment of the present invention, the demultiplexer 803 performs demultiplexing on the enhanced data packet. Similar process steps have already been described earlier in the description of the present invention. Therefore, a detailed of the process of demultiplexing the enhanced data will be omitted for simplicity.

The first descrambler 804 receives the demultiplexed signals from the demultiplexer 803 and then descrambles the received signals. At this point, the first descrambler 804 may receive the authentication result received from the authentication unit 808 and other data required for the descrambling process, so as to perform the descrambling process. The audio decoder 805 and the video decoder 806 receive the signals descrambled by the first descrambler 804, which are then decoded and outputted. Alternatively, if the first descrambler 804 did not perform the descrambling process, then the audio decoder 805 and the video decoder 806 directly decode and output the received signals. In this case, the decoded signals are received and then descrambled by the second descrambler 807 and processed accordingly.

As described above, the present invention has the following advantages. More specifically, the present invention is highly protected against (or resistant to) any error that may occur when transmitting supplemental data through a channel. And, the present invention is also highly compatible to the conventional receiving system. Moreover, the present invention may also receive the supplemental data without any error even in channels having severe ghost effect and noise.

Additionally, by performing an error correction decoding process and an error detection encoding process, robustness is provided to the enhanced data, thereby enabling the enhanced data to respond adequately and strongly against the fast and frequent change in channels. Most particularly, by creating a reliability map when performing error correction decoding on the received data, and by performing the error correction decoding process while referring to the reliability information of the reliability map, the error correction performance on the received enhanced data may be enhanced. Furthermore, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

[1. A digital television (DTV) transmitting system comprising:

a first randomizer configured to randomize enhanced data bytes;

a byte to bit converter configured to convert the randomized enhanced data bytes into bit units, thereby outputting enhanced data bits;

an encoder configured to encode each of the enhanced data bits at a code rate of 1/H and to output the encoded enhanced data bits in symbol units, wherein H>1;

a symbol interleaver configured to interleave enhanced data symbols output from the encoder according to the following equation:

$$(i)=\{S\times i\times(i+1)/2\}\text{mod}L,$$

wherein $0\leq i\leq L-1$, $L\geq B$, $L=2^n$, n and S are integers, and B is a number of symbols being inputted to the symbol interleaver;

a symbol to byte converter configured to convert the interleaved enhanced data symbols into byte units, thereby outputting enhanced data bytes;

a group formatter configured to map the converted enhanced data bytes into data groups and to add known data sequences and signaling information to each of the data groups; and a second randomizer configured to randomize MPEG header data bytes of enhanced data packets including data in the data groups.]

[2. The DTV transmitting system of claim 1, further comprising:

a Reed-Solomon (RS) frame encoder configured to perform RS encoding and Cyclic Redundancy Check (CRC) encoding on the randomized enhanced data bytes to generate an RS frame, wherein the RS frame comprises K number of packets having A bytes of the randomized enhanced data, RS parity data bytes generated based on the K number of packets, and CRC checksum data bytes generated based on the K number of packets including the RS parity data bytes, wherein K>1 and A>1.]

[3. The DTV transmitting system of claim 1, further comprising:

a trellis encoder configured to trellis-encode data in the enhanced data packets including the randomized MPEG header data bytes, wherein memories in the trellis encoder are initialized at a start of at least one of the known data sequences.]

[4. The DTV transmitting system of claim 1, wherein at least two of the known data sequences have different lengths.]

[5. A method of processing broadcast data in a digital television (DTV) transmitting system, the method comprising:

randomizing, by a first randomizer, enhanced data bytes;

converting, by a byte to bit converter, the randomized enhanced data bytes into bit units, thereby outputting enhanced data bits;

encoding, by an encoder, each of the enhanced data bits at a code rate of 1/H and outputting the encoded enhanced data bits in symbol units, wherein H>1;

interleaving, by a symbol interleaver, enhanced data symbols output from the encoder according to the following equation:

$$P(i)=\{S\times i\times(i+1)/2\}\text{mod}L,$$

wherein $0\leq i\leq L-1$, LB, $L=2^n$, n and S are integers, and B is a number of symbols being inputted to the symbol interleaver;

converting, by a symbol to byte converter, the interleaved enhanced data symbols into byte units, thereby outputting enhanced data bytes;

mapping the converted enhanced data bytes into data groups and adding known data sequences and signaling information to each of the data groups; and randomizing, by a second randomizer, MPEG header data bytes of enhanced data packets including data in the data groups.]

[6. The method of claim 5, further comprising:

performing RS encoding and Cyclic Redundancy Check (CRC) encoding on the randomized enhanced data bytes to generate an RS frame, wherein the RS frame comprises K number of packets having A bytes of the randomized enhanced data, RS parity data bytes generated based on the K number of packets, and CRC checksum data bytes generated based on the K number of packets including the RS parity data bytes, wherein K>1 and A>1.]

[7. The method of claim 5, further comprising:

trellis-encoding, by a trellis encoder, data in the enhanced data packets including the randomized MPEG header data bytes, wherein memories in the trellis encoder are initialized at a start of at least one of the known data sequences.]

[8. The method of claim 5, wherein at least two of the known data sequences have different lengths.]

*9. A method for processing broadcast data, the method comprising:*

*preprocessing broadcast data, wherein the broadcast data to be preprocessed are included in MPEG-2 transport stream (TS) packets, wherein the TS packets have a fixed length with a first byte being a sync-byte, and wherein the sync-byte is removed;*

*encoding the preprocessed broadcast data for forward error correction (FEC) by adding parity data,*

*wherein a number of input packets including the preprocessed broadcast data are encoded into a FEC frame, and the FEC frame includes Cyclic Redundancy Check (CRC) parity data and parity data for forward error correction (FEC);*

*interleaving the encoded broadcast data;*

*arranging the interleaved broadcast data in frames,*

*wherein different types of broadcast data which are encoded by different type of code rates, respectively, are included in different locations in the frames; and*

*transmitting a broadcast signal carrying the frames.*

* * * * *